(12) United States Patent
Fork

(10) Patent No.: US 7,928,015 B2
(45) Date of Patent: Apr. 19, 2011

(54) SOLAR CELL FABRICATION USING EXTRUDED DOPANT-BEARING MATERIALS

(75) Inventor: David K. Fork, Los Altos, CA (US)

(73) Assignee: Palo Alto Research Center Incorporated, Palo Alto, CA (US)

( * ) Notice: Subject to any disclaimer, the term of this patent is extended or adjusted under 35 U.S.C. 154(b) by 1128 days.

(21) Appl. No.: 11/609,825

(22) Filed: Dec. 12, 2006

(65) Prior Publication Data

US 2008/0138456 A1    Jun. 12, 2008

(51) Int. Cl.
*H01L 21/31* (2006.01)

(52) U.S. Cl. .... 438/759; 438/758; 438/761; 257/E21.24

(58) Field of Classification Search ............... 438/758, 438/759, 761; 257/E21.24
See application file for complete search history.

(56) References Cited

U.S. PATENT DOCUMENTS

| | | |
|---|---|---|
| 2,031,387 A | 2/1936 | Schwarz |
| 2,789,731 A | 4/1957 | Marraffino |
| 3,032,008 A | 5/1962 | Land et al. |
| 3,159,313 A | 12/1964 | Guilford |
| 3,602,193 A | 8/1971 | Adams et al. |
| 3,973,994 A | 8/1976 | Redfield |
| 3,988,166 A | 10/1976 | Beam |
| 4,018,367 A | 4/1977 | Morine et al. |
| 4,021,267 A | 5/1977 | Dettling |
| 4,045,246 A | 8/1977 | Mlavsky et al. |
| 4,053,327 A | 10/1977 | Meulenberg, Jr. |
| 4,084,985 A | 4/1978 | Evans, Jr. |
| 4,086,485 A | 4/1978 | Kaplow et al. |
| 4,095,997 A | 6/1978 | Griffiths |
| 4,104,091 A * | 8/1978 | Evans et al. ............. 438/57 |
| 4,119,058 A | 10/1978 | Schmermund |
| 4,131,485 A | 12/1978 | Meinel et al. |
| 4,141,231 A | 2/1979 | Kudlich |

(Continued)

FOREIGN PATENT DOCUMENTS

CN     1346517 A    4/2002
(Continued)

OTHER PUBLICATIONS

Knight et al. "Hydrodynamic Focusing on a Silicon Chip: Mixing Nanoliters in Microseconds", Physical Review Letters, vol. 80, No. 17, Apr. 27, 1998, pp. 3863-3866.

(Continued)

*Primary Examiner* — Thinh T Nguyen
(74) *Attorney, Agent, or Firm* — Bever, Hoffman & Harms, LLP; Patrick T. Bever

(57) ABSTRACT

Wafer-based solar cells are efficiently produced by extruding a dopant bearing material (dopant ink) onto one or more predetermined surface areas of a semiconductor wafer, and then thermally treating the wafer to cause diffusion of dopant from the dopant ink into the wafer to form corresponding doped regions. A multi-plenum extrusion head is used to simultaneously extrude interdigitated dopant ink structures having two different dopant types (e.g., n-type dopant ink and p-type dopant ink) in a self-registered arrangement on the wafer surface. The extrusion head is fabricated by laminating multiple sheets of micro-machined silicon that define one or more ink flow passages. A non-doping or lightly doped ink is co-extruded with heavy doped ink to serve as a spacer or barrier, and optionally forms a cap that entirely covers the heavy doped ink. A hybrid thermal treatment utilizes a gaseous dopant to simultaneously dope exposed portions of the wafer.

18 Claims, 19 Drawing Sheets

U.S. PATENT DOCUMENTS

| | | | |
|---|---|---|---|
| 4,148,301 | A | 4/1979 | Cluff |
| 4,153,476 | A | 5/1979 | Frosch et al. |
| 4,177,083 | A | 12/1979 | Kennedy |
| 4,205,216 | A | 5/1980 | Douglas |
| 4,221,468 | A | 9/1980 | Macken |
| 4,223,202 | A | 9/1980 | Peters et al. |
| 4,224,081 | A | 9/1980 | Kawamura et al. |
| 4,254,894 | A | 3/1981 | Fetters |
| 4,331,703 | A | 5/1982 | Lindmayer |
| 4,337,758 | A | 7/1982 | Meinel et al. |
| 4,355,196 | A | 10/1982 | Chai |
| 4,461,403 | A | 7/1984 | Prahs |
| 4,476,165 | A | 10/1984 | McIntyre |
| 4,479,027 | A * | 10/1984 | Todorof .................. 136/249 |
| 4,490,418 | A | 12/1984 | Yoshida |
| 4,521,457 | A | 6/1985 | Russell et al. |
| 4,533,814 | A | 8/1985 | Ward |
| 4,540,843 | A | 9/1985 | Gochermann et al. |
| 4,589,191 | A | 5/1986 | Green et al. |
| 4,602,120 | A | 7/1986 | Wakefield et al. |
| 4,609,037 | A | 9/1986 | Wheeler et al. |
| 4,683,348 | A | 7/1987 | Pidgeon et al. |
| 4,746,370 | A | 5/1988 | Woolf |
| 4,747,517 | A | 5/1988 | Hart |
| 4,792,685 | A | 12/1988 | Yamakawa |
| 4,796,038 | A | 1/1989 | Allen et al. |
| 4,826,777 | A | 5/1989 | Ondris |
| 4,841,946 | A | 6/1989 | Marks |
| 4,847,349 | A | 7/1989 | Ohta et al. |
| 4,849,028 | A | 7/1989 | Krause |
| 4,855,884 | A | 8/1989 | Richardson |
| 4,896,015 | A | 1/1990 | Taboada et al. |
| 4,933,623 | A | 6/1990 | Fox |
| 4,938,994 | A | 7/1990 | Choinski |
| 4,947,825 | A | 8/1990 | Moriarty |
| 4,952,026 | A | 8/1990 | Bellman et al. |
| 4,996,405 | A | 2/1991 | Poumey et al. |
| 5,000,988 | A | 3/1991 | Inoue et al. |
| 5,004,319 | A | 4/1991 | Smither |
| 5,011,565 | A | 4/1991 | Dube et al. |
| 5,062,899 | A | 11/1991 | Kruer |
| 5,075,281 | A | 12/1991 | Testardi |
| 5,089,055 | A | 2/1992 | Nakamura |
| 5,151,377 | A | 9/1992 | Hanoka et al. |
| 5,167,724 | A | 12/1992 | Chiang |
| 5,180,441 | A | 1/1993 | Cornwall et al. |
| 5,188,789 | A | 2/1993 | Nishiura |
| 5,213,628 | A | 5/1993 | Noguchi et al. |
| 5,216,543 | A | 6/1993 | Calhoun |
| 5,254,388 | A | 10/1993 | Melby et al. |
| 5,344,496 | A | 9/1994 | Stern et al. |
| 5,353,813 | A | 10/1994 | Deevi et al. |
| 5,356,488 | A | 10/1994 | Hezel |
| 5,389,159 | A | 2/1995 | Kataoka et al. |
| 5,449,413 | A | 9/1995 | Beauchamp et al. |
| 5,501,743 | A | 3/1996 | Cherney |
| 5,529,054 | A | 6/1996 | Shoen |
| 5,536,313 | A | 7/1996 | Watanabe et al. |
| 5,538,563 | A | 7/1996 | Finkl |
| 5,540,216 | A | 7/1996 | Rasmusson |
| 5,543,333 | A | 8/1996 | Holdermann |
| 5,552,820 | A | 9/1996 | Genovese |
| 5,559,677 | A | 9/1996 | Errichiello |
| 5,560,518 | A | 10/1996 | Catterall et al. |
| 5,569,399 | A | 10/1996 | Penney et al. |
| 5,590,818 | A | 1/1997 | Raba et al. |
| 5,665,175 | A | 9/1997 | Safir |
| 5,700,325 | A | 12/1997 | Watanabe |
| 5,733,608 | A | 3/1998 | Kessel et al. |
| 5,751,436 | A | 5/1998 | Kwon et al. |
| 5,873,495 | A | 2/1999 | Saint-Germain |
| 5,916,461 | A | 6/1999 | Costin et al. |
| 5,918,771 | A | 7/1999 | van der Heijden |
| 5,929,530 | A | 7/1999 | Stone |
| 5,949,123 | A | 9/1999 | Le et al. |
| 5,981,902 | A | 11/1999 | Arita et al. |
| 5,990,413 | A | 11/1999 | Ortabasi |
| 6,008,449 | A | 12/1999 | Cole |
| 6,011,307 | A | 1/2000 | Jiang et al. |
| 6,020,554 | A | 2/2000 | Kaminar et al. |
| 6,032,997 | A | 3/2000 | Elliott et al. |
| 6,047,862 | A | 4/2000 | Davies |
| 6,091,017 | A | 7/2000 | Stern |
| 6,118,067 | A | 9/2000 | Lashley et al. |
| 6,130,465 | A | 10/2000 | Cole |
| 6,140,570 | A | 10/2000 | Kariya |
| 6,164,633 | A | 12/2000 | Mulligan et al. |
| 6,183,186 | B1 | 2/2001 | Howells et al. |
| 6,203,621 | B1 | 3/2001 | Tran et al. |
| 6,232,217 | B1 | 5/2001 | Ang et al. |
| 6,257,450 | B1 | 7/2001 | Jackson et al. |
| 6,274,508 | B1 | 8/2001 | Jacobsen et al. |
| 6,278,054 | B1 | 8/2001 | Ho et al. |
| 6,293,498 | B1 | 9/2001 | Stanko et al. |
| 6,310,281 | B1 | 10/2001 | Wendt et al. |
| 6,323,415 | B1 | 11/2001 | Uematsu et al. |
| RE37,512 | E | 1/2002 | Szlufcik et al. |
| 6,351,098 | B1 | 2/2002 | Kaneko |
| 6,354,791 | B1 | 3/2002 | Wytman et al. |
| 6,379,521 | B1 | 4/2002 | Nishio |
| 6,398,370 | B1 | 6/2002 | Chiu et al. |
| 6,407,329 | B1 | 6/2002 | Iino et al. |
| 6,410,843 | B1 | 6/2002 | Kishi et al. |
| 6,413,113 | B2 | 7/2002 | Uher et al. |
| 6,418,986 | B1 | 7/2002 | Gabriele |
| 6,420,266 | B1 | 7/2002 | Smith et al. |
| 6,429,037 | B1 | 8/2002 | Wenham et al. |
| 6,459,418 | B1 * | 10/2002 | Comiskey et al. ............ 345/107 |
| 6,479,395 | B1 | 11/2002 | Smith et al. |
| 6,527,964 | B1 | 3/2003 | Smith et al. |
| 6,531,653 | B1 | 3/2003 | Glenn et al. |
| 6,555,739 | B2 | 4/2003 | Kawam |
| 6,568,863 | B2 | 5/2003 | Murata |
| 6,590,235 | B2 | 7/2003 | Carey et al. |
| 6,597,510 | B2 | 7/2003 | Bunkenburg et al. |
| 6,623,579 | B1 | 9/2003 | Smith et al. |
| 6,663,944 | B2 | 12/2003 | Park et al. |
| 6,666,165 | B2 | 12/2003 | Shiraishi et al. |
| 6,667,434 | B2 | 12/2003 | Morizane et al. |
| 6,743,478 | B1 | 6/2004 | Kiiha et al. |
| 6,890,167 | B1 | 5/2005 | Kwok et al. |
| 6,896,381 | B2 | 5/2005 | Benitez et al. |
| 6,924,493 | B1 | 8/2005 | Leung |
| 6,979,798 | B2 | 12/2005 | Gu et al. |
| 7,002,675 | B2 | 2/2006 | MacGibbon et al. |
| 7,045,794 | B1 | 5/2006 | Spallas et al. |
| 7,101,592 | B2 | 9/2006 | Gueggi et al. |
| 7,129,592 | B1 | 10/2006 | Yetter |
| 7,152,985 | B2 | 12/2006 | Benitez et al. |
| 7,160,522 | B2 | 1/2007 | Minano Dominguez et al. |
| 7,181,378 | B2 | 2/2007 | Benitez et al. |
| 7,388,147 | B2 | 6/2008 | Mulligan et al. |
| 7,394,016 | B2 | 7/2008 | Gronet |
| 2001/0008230 | A1 | 7/2001 | Keicher et al. |
| 2002/0056473 | A1 | 5/2002 | Chandra et al. |
| 2002/0060208 | A1 | 5/2002 | Liu et al. |
| 2002/0127953 | A1 | 9/2002 | Doan et al. |
| 2002/0148497 | A1 | 10/2002 | Sasaoka et al. |
| 2002/0149107 | A1 | 10/2002 | Chang et al. |
| 2002/0154396 | A1 | 10/2002 | Overbeck |
| 2003/0015820 | A1 | 1/2003 | Yamazaki et al. |
| 2003/0095175 | A1 | 5/2003 | Agorio |
| 2003/0129810 | A1 | 7/2003 | Barth et al. |
| 2003/0213429 | A1 | 11/2003 | Kreuzer |
| 2003/0232174 | A1 | 12/2003 | Chang et al. |
| 2004/0012676 | A1 | 1/2004 | Weiner |
| 2004/0031517 | A1 | 2/2004 | Bareis |
| 2004/0048001 | A1 | 3/2004 | Kiguchi et al. |
| 2004/0070855 | A1 | 4/2004 | Benitez et al. |
| 2004/0084077 | A1 | 5/2004 | Aylaian |
| 2004/0151014 | A1 | 8/2004 | Speakman |
| 2004/0191422 | A1 | 9/2004 | Kataoka |
| 2004/0200520 | A1 | 10/2004 | Mulligan et al. |
| 2004/0211460 | A1 | 10/2004 | Simburger et al. |
| 2005/0000566 | A1 | 1/2005 | Posthuma et al. |
| 2005/0029236 | A1 | 2/2005 | Gambino et al. |
| 2005/0034751 | A1 | 2/2005 | Gross et al. |

| | | | |
|---|---|---|---|
| 2005/0046977 | A1 | 3/2005 | Shifman |
| 2005/0067729 | A1 | 3/2005 | Laver et al. |
| 2005/0081908 | A1 | 4/2005 | Stewart |
| 2005/0133084 | A1 | 6/2005 | Joge et al. |
| 2005/0194037 | A1 | 9/2005 | Asai |
| 2005/0221613 | A1 | 10/2005 | Ozaki et al. |
| 2005/0253308 | A1 | 11/2005 | Sherwood |
| 2006/0046269 | A1 | 3/2006 | Thompson et al. |
| 2006/0076105 | A1 | 4/2006 | Furui et al. |
| 2006/0207650 | A1 | 9/2006 | Winston et al. |
| 2006/0231133 | A1 | 10/2006 | Fork et al. |
| 2006/0251796 | A1 | 11/2006 | Fellingham |
| 2006/0266235 | A1 | 11/2006 | Sandhu et al. |
| 2008/0047605 | A1 | 2/2008 | Benitez et al. |
| 2008/0138456 | A1 | 6/2008 | Fork et al. |

FOREIGN PATENT DOCUMENTS

| | | | |
|---|---|---|---|
| CN | 2606309 | Y | 3/2004 |
| CN | 1854637 | A | 11/2006 |
| DE | 197 35 281 | A1 | 2/1999 |
| EP | 0 257 157 | A | 3/1988 |
| EP | 0 851 511 | A | 7/1998 |
| EP | 1 145 797 | A | 10/2001 |
| EP | 1351318 | A | 10/2003 |
| EP | 1 715 260 | A | 10/2006 |
| EP | 1 763 086 | A | 3/2007 |
| EP | 1 787 786 | A | 5/2007 |
| EP | 1 833 099 | A | 9/2007 |
| JP | 60082680 | A | 5/1985 |
| JP | 02055689 | A | 2/1990 |
| JP | 02 187291 | A | 7/1990 |
| JP | 2002-111035 | A | 4/2002 |
| JP | 2004-266023 | A | 9/2004 |
| WO | WO 91/08503 | A | 6/1991 |
| WO | WO 92/15845 | A | 9/1992 |
| WO | WO 94/28361 | A1 | 12/1994 |
| WO | WO 97/21253 | A | 6/1997 |
| WO | WO 97/48519 | A | 12/1997 |
| WO | WO 00/49421 | A1 | 8/2000 |
| WO | WO 00/49658 | A1 | 8/2000 |
| WO | WO 02/052250 | A | 7/2002 |
| WO | WO 02/097724 | A1 | 12/2002 |
| WO | WO 03/047005 | A | 6/2003 |
| WO | WO 03/076701 | A | 9/2003 |
| WO | WO 2005/070224 | A1 | 8/2005 |
| WO | WO 2005/107957 | A1 | 11/2005 |
| WO | WO 2005/107958 | A1 | 11/2005 |
| WO | WO 2006/097303 | A | 9/2006 |
| WO | WO 2007/104028 | | 9/2007 |

OTHER PUBLICATIONS

Raabe et al. "High Aspect Ratio Screen Printed Fingers", 20th European Solar Energy Conference and Exhibition, Barcelona, Spain, Jun. 6-10, 2005, 4 pages.

Bejan, A. "Chapter Five, Buckling Flows: A New Frontier in Fluid Mechanics," Annual Review of Numerical Fluid Mechanics and Heat Transfer, vol. 1, Ed. T. C. Chawla, Hemisphere Publishing Corporation, 1987, pp. 262-304.

Liang et al. "Co-Extrusion of Solid Oxide Fuel Cell Functional Elements", Ceramic Engineering and Science Proceedings, vol. 20, No. 4, 1999, pp. 587-594.

Shannon et al. "The Production of Alumina/Zirconia Laminated Composites by Co-Extrusion", Ceramic Engineering and Science Proceedings, vol. 16, No. 5, 1955, pp. 1115-1120.

Kenis et al. "Microfabrication Inside Capillaries Using Multiphase Laminar Flow Patterning", Science, vol. 285, Jul. 2, 1999, pp. 83-85.

Szlufcik et al. "Low-Cost Industrial Technologies of Crystalline Silicon Solar Cells", Proc. of the IEEE, vol. 85, No. 5, May 1, 1997, pp. 711-730.

Ruthe et al. "Etching of CuInSe2 Thin Films-Comparison of Femtosecond and Picosecond Laser Ablation", Applied Surface Science, vol. 247, No. 1-4, Jul. 15, 2005, pp. 447-452.

Sparber et al. "Comparison of texturing methods for monocrystalline silicon solar cells using KOH and $Na_2CO_3$," $3^{rd}$ World Conf. Photovoltaic Energy Conversion, Osaka, 2003, pp. 1372-1375.

MacDonald et al. "Texturing industrial multicrystalline silicon solar cells," Solar Energy, vol. 76, 2004, pp. 277-283.

Tool et al. "Straightforward in-line processing for 16.8% efficient mc-Si solar cells," $31^{st}$ IEEE Photovoltaic Specialists Conf., Florida, 2005, pp. 1324-1327.

Fukui et al. "17.7% efficiency large area multicrystalline silicon solar cell using screen-printed metallization technique," $31^{st}$ IEEE Photovoltaic Specialists Conf., Florida, 2005, pp. 979-982.

Mitsubishi Electric Corp., Mitsubishi Electric Develops Practical-Use Multi-Crystalline Silicon Solar Cell with World's Highest Conversion Efficiency Rate of 18.6%, News Release #2432, Tokyo, Mar. 19, 2008, Available URL: http://global.mitsubishielectric.com/news/news_releases/2008/mel0705.pdf.

Zhao et al. "19.8% efficient 'honeycomb' textured multicrystalline and 24.4% monocrystalline silicon solar cells," Applied Physics Letters, vol. 73, pp. 1991-1993, 1998.

Abbott et al. "Optical and Electrical Properties of Laser Texturing for High-efficiency Solar Cells," Progress in Photovoltaics: Research and Applications, Published online Jan. 5, 2006, vol. 14, pp. 225-235, 2006.

Murphy, Jr. "Home photovoltaic systems for physicists," Physics Today, Jul. 2008, pp. 42-47.

Brogren et al. "Optical properties, durability, and system aspects of a new aluminum-polymer-laminated steel reflector for solar concentrators", Jan. 2004, Solar Energy Materials and Solar Cells, 82, pp. 387-412.

Mauk et al. "'Buried' Metal/Dielectric/Semiconductor Reflectors for Light Trapping in Epitaxial Thin-Film Solar Cells", May 1996, IEEE, 25th PVSC, pp. 147-150.

Munzer et al. "Thin Monocrystalline Silicon Solar Cells, Oct. 1999, IEEE Transactions on Electron Devices", vol. 46, No. 10, pp. 2055-2061.

Kerschaver et al. "Back-contact Solar Cells: A Review," Progress in Photovoltaics: Research and Applications, 2006, vol. 14, pp. 107-123.

Neuhaus et al. "Industrial Silicon Wafer Solar Cells," Advances in OptoElectronics, vol. 2007, 2007, 15 pages.

SunPower Corp. News Release, May 12, 2008, Available URL: http://investors.sunpowercorp.com/releasedetail.cfm?ReleaseID=309613.

Schweizer, Peter M. "Curtain Coating Technology Can Mean Big Benefits," Paper, Film & Foil Converter website, Mar. 1, 2000, 5 pages, http://pffc-online.com/mag/paper_curtain_coating_technology/.

Nijs et al. "Overview of solar cell technologies and results on high efficiency multicrystalline silicon substrates," Solar Energy Materials and Solar Cells, vol. 48, No. 1-4, Nov. 1, 1997, pp. 199-217.

Alvarez et al. "RXI Concentrator For 1000X Photovoltaic Energy Conversion".

Benitez et al. "High-Concentration Mirror-Based Kohler Integrating System for Tandem Solar Cells", WCPEC2006, 4 pages.

Bett et al. "FLATCON™ and FLASHCON™ Concepts for High Concentration PV", Presented at the $19^{th}$ European Photovoltaic Solar Energy Conf., Jun. 7-11, 2004, Paris, 4 pages.

Gordon et al. "Optical performance at the thermodynamic limit with tailored imaging designs", Applied Optics, in press, Dec. 2004, 16 pages.

Kenis et al. "Fabrication inside Microchannels Using Fluid Flow", Accounts of Chemical Research, vol. 33, No. 12, 2000, pp. 841-847.

Mulligan et al. "A Flat-Plate Concentrator: Micro-Concentrator Design Overview", 2000 IEEE, pp. 1495-1497.

Mulligan et al. "Development of Chip-Size Silicon Solar Cells".

Nguyen, Luu "Wafer Level Packaging For Analog/Mixed Signal Applications", MEPTEC Int. Wafer Level Packaging Conference, Aug. 22, 2002, 41 pages.

Sun et al. "Modeling and Experimental Evaluation of Passive Heat Sinks for Miniature High-Flux Photovoltaic Concentrators", Transactions of the ASME, vol. 127, pp. 138-145 (2005).

Sundararajan et al. "Three-Dimensional Hydrodynamic Focusing in Polydimethylsiloxane (PDMS) Microchannels", Journal of Microelectromechanical Systems, vol. 13, No. 4, Aug. 2004, pp. 559-567.

Swanson, Richard M. "The Promise of Concentrators", *Prog. Photovolt. Res. Appl.* 8, pp. 93-111 (2000).

Terao et al. "A Mirror-Less Design for Micro-Concentrator Modules", Conference Record of the 28$^{th}$ IEEE Photovoltaic Specialists Conference (2000) pp. 1416-1419.

Terao, Akira "MicroDish: A Novel Reflective Optic for Flat-Plate Micro-Concentrator", SPIE's 49$^{th}$ Annual Meeting, Aug. 2-6, 2004, Denver, Colorado, USA, 9 pages.

Cousins et al. "Manufacturing and Design Issues for Thin Silicon Solar Cells Manufactured on FZ(B), MCZ(B), CZ(Ga) and CZ(B) Wafers", IEEE, pp. 987-990, 2005.

Cuevas et al. "50 Per Cent More Output Power from an Albedo-Collecting Flat Panel Using Bifacial Solar Cells", *Solar Energy*, vol. 29, No. 5, pp. 419-420, 1982.

Finlayson et al. "$Bi_2O_3$-$Wo_3$ compounds for photocatalytic applications by solid state and viscous processing", Title from a conference scheduled for Oct. 6-7, 2004 in Munich, 8 pages.

Kränzl et al. "Bifacial Solar Cells on Multi-Crystalline Silicon", 15$^{th}$ International Photovoltaic Science & Engineering Conference, Shanghai, China, 2 pages, 2005.

Mueller et al. "Breathable Polymer Films Produced by the Microlayer Coextrusion Process", Journal of Applied Polymer Science, vol. 78, pp. 816-828, 2000.

Rao et al. "Microfabricated Deposition Nozzles for Direct-Write Assembly of Three-Dimensional Periodic Structures", *Advanced Materials*, vol. 17, No. 3, Feb. 10, 2005, 5 pages.

U.S. Appl. No. 11/282,882, filed Nov. 17, 2005, Fork et al.

Recart et al. "Large Area Thin BSF Solar Cells With Simultaneously Diffused Boron and Phosphorus Screen Printed Emitters", IEEE, pp. 1213-1216, 2005.

Taguchi et al. An Approach for the Higher Efficiency in the HIT Cells, IEEE, pp. 866-871, 2005.

Van Hoy et al. "Microfabrication of Ceramics by Co-extrusion", *J. Am. Ceram. Soc.*, vol. 81, No. 1, pp. 152-158, 1998.

U.S. Appl. No. 11/282,829, filed Nov. 17, 2005, Fork et al.

U.S. Appl. No. 11/336,714, filed Jan. 20, 2006, Fork et al.

Weber et al. "Modelling of Sliver® Modules Incorporating a Lambertian Rear Reflector", The Australian National University, Canberra ACT 0200, Australia, 4 pages, 2005.

Gimac Compact Triplex TR12 Micro-Coextrusion Plant, NPE 2000, Jun. 19-23, 2000, McCormick Place, Chicago, IL, Booth 13154, http://www.citsco.com/NPE2000/npepage1.html, 2 pages.

Extrusion/Coextrusion Dies, Extrusion Dies Industries, LLC, http://www.extrusiondies.com/PRODUCTS/ExtrusionDies/multimanifoldDies.html, 1 page.

Hitachi: Offering Total Environmental Solutions, Environmental Activities, http://greenweb.hitachi.co.jp/en/sustainable/total-solution.html, 5 pages, 2003.

Sanyo Solar Panels, Sanyo HIT Solar Panel Discount—Solar Electric Supply, Sanyo Solar Modules, http://www.solarelectricsupply.com/Solar_Panels/Sanyo/sanyo.html, 4 pages, 2005.

* cited by examiner

SOLAR CELL FABRICATION USING EXTRUDED DOPANT-BEARING MATERIALS

FIELD OF THE INVENTION

This invention relates to the production of semiconductor devices, and in particular to the low cost production of large-area devices, such as silicon wafer-based solar cells, and power semiconductor devices by utilizing extrusion methods to form doped regions in the semiconductor substrate of the semiconductor device.

BACKGROUND OF THE INVENTION

Modern solar cells typically include a large-area, single layer p-n junction diode that is capable of generating electrical energy from solar light. These cells are typically made using silicon wafers that are doped to include one or more n-type doped regions, and one or more p-type doped regions. Such solar cells (also known as silicon wafer-based solar cells) are currently the dominant technology in the commercial production of solar cells, and are the main focus of the present invention.

A desirable solar cell geometry, commonly referred to as the interdigitated back contact (IBC) cell, consists of a semiconductor wafer, such as silicon, and alternating lines (interdigitated stripes) of p-type and n-type doping. This cell architecture has the advantage that all of the electrical contacts to the p and n regions can be made to one side of the wafer. When the wafers are connected together into a module, the wiring is all done from one side. Device structure and fabrication means for this device have been described previously in co-owned and co-pending U.S. patent application Ser. No. 11/336,714 entitled "Solar Cell Production Using Non-Contact Patterning and Direct-Write Metallization", which is incorporated herein by reference in its entirety.

One method for forming the alternately doped line regions in an IBC solar cell is to dispose dopant bearing pastes of alternating dopant type on the wafer, and then to heat the wafer with the appropriate temperature profile to drive in the dopants. Solar cell doping and the patterning of doped regions is typically carried out with costly steps that may include the use of barrier deposition, barrier patterning, laser processing, damage removal, and gas phase furnace diffusion. One could also generate the desired interdigitated doped regions using screen printing techniques. However, a distinct disadvantage of screen printing is that two separate print operations would be needed to write the two dopant bearing materials, and the two prints would need to be exquisitely well registered. Moreover, screen printing requires contact with the wafer, which increases the risk of wafer damage (breakage), thus increasing overall production costs. In addition, the first screen printed layer needs to be dried before a second screen print step is applied.

One commonly used solar cell architecture utilizes the back surface of the cell wafer as a broad area metal pad, typically aluminum, to form a contact to the p-type side of the device. During the metal firing step, the aluminum interacts with the silicon to form a p+ doped layer. In some cases, the back surface is also doped with boron to produce a p+ layer. The role of this layer is to create a so-called back surface field which reduces the recombination of the photocurrent on the back metallization. The broad area metal layer is commonly applied either by screen printing or pad printing, both of which are contact printing methods, and therefore increase the risk of wafer breakage.

What is needed is a low cost method and system for producing doped regions in solar cell substrates that avoids the problems associated with contact printing methods. In particular, what is needed is a simpler and more reliable method for producing self-registered p-type and n-type doped regions in the production of IBC solar cells.

SUMMARY OF THE INVENTION

The present invention is directed to a low cost method and system for producing large-area semiconductors that includes extruding a dopant bearing material (dopant ink) onto one or more predetermined surface areas of a semiconductor substrate (e.g., a monocrystalline silicon wafer), and then heating (thermal processing) the semiconductor substrate such that the dopant disposed in the dopant ink diffuses into the substrate to form the desired doped region or regions. In comparison to conventional screen printing techniques, the extrusion of dopant material on the substrate provides superior control of the feature resolution of the doped regions. In addition, by extruding the dopant ink onto the substrate, the dopant ink can be reliably disposed over the desired substrate regions without contacting the substrate, thereby avoiding the wafer breakage problem associated with conventional contact printing methods. By providing superior feature resolution and reduced wafer breakage, the present invention reduces the overall manufacturing costs associated with the production of large area semiconductor devices when compared with conventional production methods.

In accordance with an embodiment of the present invention, a system for producing large area semiconductor devices includes forming desired doped regions in surface of a semiconductor substrate using the extrusion method described above, forming a passivation layer over the substrate surface, utilizing a laser ablation or other non-contact apparatus to form contact openings in the passivation layer, and then utilizing a direct-write metallization apparatus to deposit contact structures in the contact openings and to form metallization lines on the passivation layer. By utilizing each of these non-contact processing methods, the present invention facilitates the reliable production of solar cells with minimal wafer breakage. In one alternative embodiment, residual dopant ink may be removed from the substrate surface before forming the passivation layer.

In accordance with an aspect of the present invention, a system for production of IBC-type solar cells includes an extrusion head that is capable of simultaneously extruding interdigitated dopant ink structures having two different dopant types (e.g., n-type dopant ink and p-type dopant ink) in a self-registered arrangement on a substrate surface. The extrusion head includes multiple nozzles (outlet channels) that respectively communicate at their inlet opening to a selected dopant ink source, and that have respective outlet openings disposed in a self-registered arrangement over the substrate surface. In one embodiment, every other nozzle communicates with a p-type dopant ink source, and the remaining nozzles communicate with an n-type dopant ink source, whereby each p-type extruded structure is disposed between two n-type extruded structures. The system includes an x-y table or other mechanism for moving the substrate relative to the extrusion head during the extrusion process. By utilizing such an extrusion head, both the p-type and n-type dopant ink structures are disposed simultaneously on the substrate surface in a self-registered manner, thus avoiding the delay required to allow a first screen printed dopant ink to dry before depositing a second screen printed ink, and the need to accurately register the second screen printing operation.

In accordance with another embodiment of the present invention, the extrusion head is fabricated by laminating multiple sheets of micro-machined silicon, plastic or other non-ferrous materials. It is important to dispense the dopant ink without the introduction of harmful impurities, and transition metal impurities are in particular to be avoided. This requirement makes the use of ferrous metal-based fluidic systems undesirable. The bonding of micromachined silicon wafers is a well understood and reliable process. The extrusion head can be formed such that the two dopant inks are fed from opposite sides of the nozzle array, or the extrusion head can be formed using a "side shooter" arrangement in which both dopant inks are fed from the same side to the nozzle array.

In accordance with additional alternative embodiment, a third (e.g., relatively light doping or non-doping) ink is extruded together with the two relatively heavy dopant inks such that each adjacent pair of heavy dopant ink structures is separated by a lightly or non-doping ink structure. The non-doping ink may serve as a spacer between dopant ink structures and/or as barrier to prevent doping from the ambient. In an alternative embodiment in which it is desirable for device performance reasons, the heavily n-type and p-type doped structures are separated by lightly doped ink that generates a lightly doped semiconductor region between the two heavily doped regions.

In accordance with yet another embodiment, the narrow lines of heavily doped ink are embedded between wider lines of a second (e.g., non-doping) ink. The narrow lines are generated by forming the extrusion head such that selected nozzle channels converge adjacent to their associated outlet openings. In contrast, the nozzle channels for the non-doping ink diverge prior to reaching the head outlet, which further squeezes the narrow lines and forms a continuous sheet in which the narrow lines are disposed between wide non-doping structures. Full control of the line width is both a function of the extrusion head design as well as the relative flow rates of the materials.

According to another embodiment of the present invention, an extrusion head includes a single plenum that feeds several diverging nozzle channels that terminate before an end facet of the extrusion head, thereby generating a flow merging section that produces a uniform extruded sheet of dopant or metal paste. This extrusion head provides an alternative non-contact method for forming so-called back surface fields that reduce the recombination of the photocurrent on the back metallization, thereby reducing manufacturing costs by avoiding the wafer breakage associated with conventional screen printing or pad printing methods.

According to another embodiment of the present invention, a hybrid doping method uses a combination of solid source doping and gas phase doping. Dopant ink structures are extruded on a wafer in the manner described above, but non-doping structures are also formed on each side of the dopant ink structures, and gaps are intentionally formed such that selected surface areas are intentionally exposed between the extruded structures. A temperature anneal of the substrate is then performed in an ambient containing a gaseous phase dopant. The thermal processing in conjunction with the doping ambient results in both solid source doping in the covered regions, and ambient source doping in the exposed regions.

In accordance with another embodiment, extruded dopant ink structures are capped (entirely covered) by a co-extruded material. A known problem with the solid source doping is that while the dopants are diffusing, they diffuse out of the source and onto other parts of the wafer, creating an undesirable doping effect in the surrounding portions of the wafer. By capping the dopant ink structures, the dopant ink is prevented from contaminating other portions of the wafer. The capping structure is optionally removed after thermal treatment is completed.

BRIEF DESCRIPTION OF THE DRAWINGS

These and other features, aspects and advantages of the present invention will become better understood with regard to the following description, appended claims, and accompanying drawings, where:

DETAILED DESCRIPTION OF THE DRAWINGS

The present invention relates to an improvement in the production of large area semiconductor devices. The following description is presented to enable one of ordinary skill in the art to make and use the invention as provided in the context of a particular application and its requirements. As used herein, directional terms such as "upper", "upwards", "lower", "downward", "front", "rear", are intended to provide relative positions for purposes of description, and are not intended to designate an absolute frame of reference. In addition, the phrases "integrally connected" and "integrally molded" is used herein to describe the connective relationship between two portions of a single molded or machined structure, and are distinguished from the terms "connected" or "coupled" (without the modifier "integrally"), which indicates two separate structures that are joined by way of, for example, adhesive, fastener, clip, or movable joint. Various modifications to the preferred embodiment will be apparent to those with skill in the art, and the general principles defined herein may be applied to other embodiments. Therefore, the present invention is not intended to be limited to the particular embodiments shown and described, but is to be accorded the widest scope consistent with the principles and novel features herein disclosed.

Figure 1:
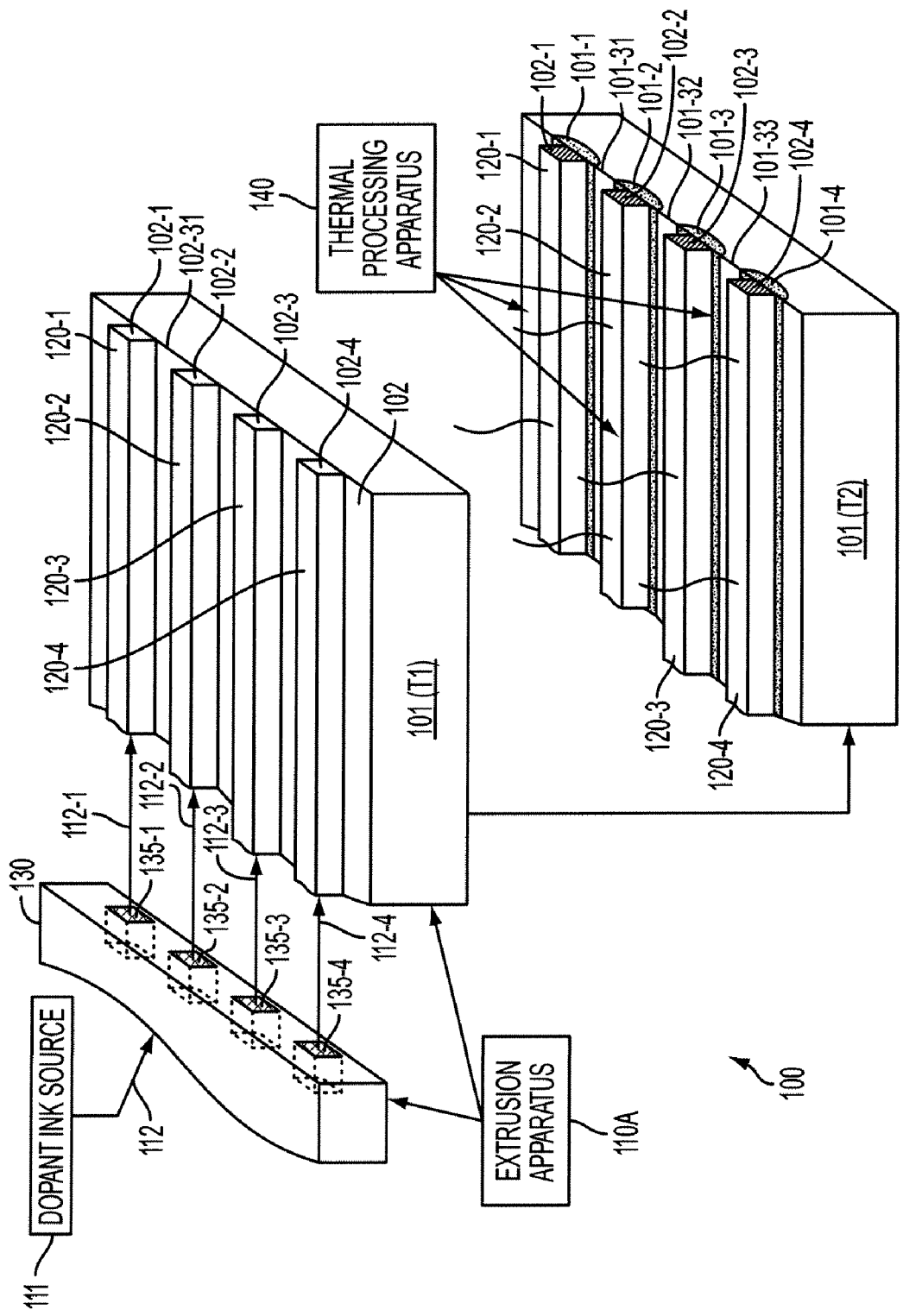
FIG. 1 is a simplified perspective view showing a wafer processing apparatus in accordance with a generalized embodiment of the present invention.

FIG. 1 is a simplified perspective view illustrating a wafer processing apparatus 100 for producing an integrated circuit (e.g., a solar cell) on a semiconductor substrate 101 in accordance with a generalized embodiment of the present invention. Wafer processing apparatus 100 generally includes an extrusion apparatus 110A for forming extruded structures 120-1 to 120-4 on substrate 101 during a first time period (Ti), and thermal processing (heating) apparatus 140 for heating substrate 101 during a second time period (T2) such that dopant diffuses from extruded structures 120-1 to 120-4 into substrate 101 to form doped regions 101-1 to 101-4, respectively. Subsequent processing of substrate 101 is described below.

Extrusion apparatus 110A includes an extrusion head (die) 130 that is operably coupled to a reservoir (dopant ink source) 111 containing a dopant ink 112. Extrusion has been utilized in a wide variety of applications, but is not believed to have been used in the production of large area semiconductor devices, and in particular in the formation of doped regions in a semiconductor substrate. Extrusion is a well-established manufacturing process that is typically used to create relatively long, narrow objects of a fixed cross-sectional profile. Similar to traditional extrusion processes, dopant ink 112 is pushed and/or drawn through outlet orifices 135-1 to 135-4, which are defined in extrusion head 130 using known techniques (e.g., using a suitable pump or auger), thereby generating multiple dopant ink beads 112-1 to 112-4. Outlet orifices 135-1 to 135-4 are formed in a selected shape (e.g., rectangular) such that beads 112-1 to 112-4 have the desired cross-sectional shape. A suitable mechanism (not shown) is utilized to move substrate 101 relative to output orifices 135-1 to 135-4 during the extrusion process, thereby depositing beads 112-1 to 112-4 on surface areas 102-1 to 102-4, respectively, thereby forming extruded structures 120-1 to 120-4 on substrate 101. In one embodiment, extruded structures 120-1 to 120-4 are separated by open (uncovered) regions of surface 102. For example, extruded structures 120-1 and 120-2 are separated by an open surface region 102-31.

In accordance with an embodiment, dopant ink 112 includes a paste-like vehicle material into which a desired n-type or p-type dopant is disbursed. For example, a suitable extrudable phosphorus dopant ink includes one or more of a variety of organometallic phosphorus compounds in which phosphorus containing substituent groups are present in compounds with carbon chains of varying lengths. These compounds must either be liquids at room temperature or completely soluble in the other solvents present in the formulation. The phosphorus dopant ink also includes dilute solutions of phosphoric acid. In addition, a fugitive organic vehicle is used that burns off or evaporates during processing. These vehicles are typically solutions of ethyl cellulose in high boiling solvents (b.p. 150-300 degrees C.) such as 2,2,4-trimethyl-1,3-pentanediol monoisobutyrate (trade name Texanol), terpineol, butyl carbitol and many others known to those skilled in the art. Finally, the phosphorus dopant ink may include Theological additives such as hydrogenated castor oil and plasticizers such as various phthalates (dimethyl phthalate, dibutyl phthalate, dioctyl phthalate, etc). Surfactants and wetting agents may be included as well. Other dopant inks in a paste form that may be suitable for extrusion are disclosed in "Paste Development for Low Cost High Efficiency Silicon Solar Cells," Jalal Salami, FERRO Corporation, Electronic Material Systems, USA 16th Workshop on Crystalline Silicon Solar Cells & Modules: Materials and Processes, Aug. 6-9, 2006, Denver, Colo.

At a subsequent time, i.e., after extruded structures 120-1 to 120-4 are formed on substrate 101, substrate 101 is heated using a thermal processing apparatus 140. In one embodiment, thermal processing apparatus 140 is an oven or kiln maintained at a temperature of 850° C. or higher. This heating process causes the dopant disposed in extruded structures 120-1 to 120-4 to diffuse into substrate 101 through surface areas 102-1 to 102-4, respectively, and to form doped regions 101-1 to 101-4, respectively. In one embodiment, extruded structures 120-1 to 120-4 are separated by a sufficient distance such that each doped region is separated from adjacent doped regions by a region of lightly doped or intrinsic (undoped) silicon. For example, doped regions 101-1 and 101-2 are separated by an intrinsic region 101-31, doped regions 101-2 and 101-3 are separated by an intrinsic region 101-32, and doped regions 101-3 and 101-4 are separated by an intrinsic region 101-33.

Figure 2:
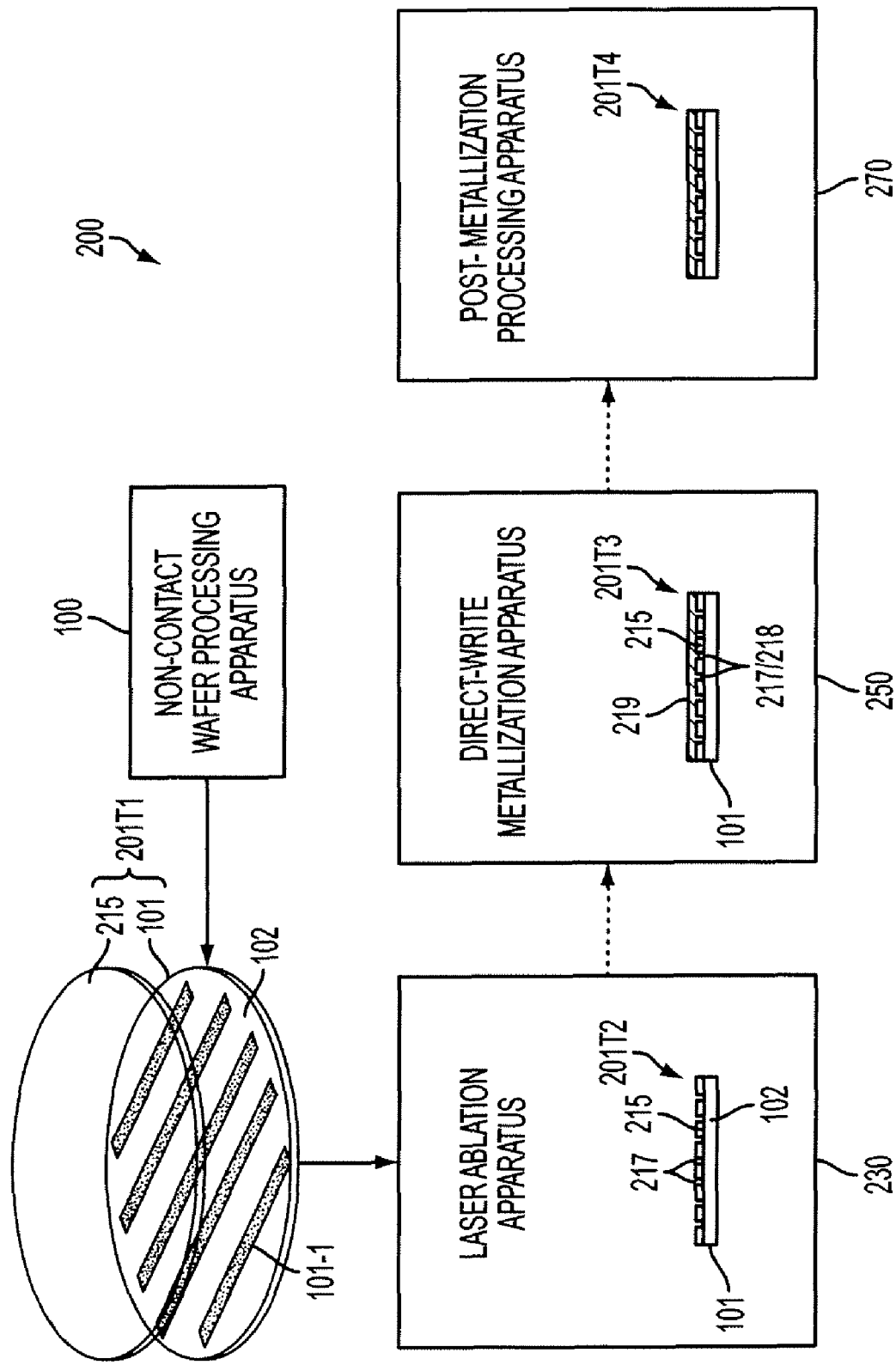
FIG. 2 is a block diagram showing a system for producing wafer-based solar cells using the wafer processing apparatus of FIG. 1 according to an embodiment of the present invention.

FIG. 2 depicts a system 200 for fabricating wafer-based solar cells using extrusion-based wafer processing apparatus 100 (FIG. 1) and other non-contact processing techniques in accordance with another embodiment of the present invention.

As indicated at the top of FIG. 2, the fabrication process utilizes wafer processing apparatus 100 to form one or more doped regions (e.g., elongated doped region 101-1) in a wafer (substrate) 101, and then substrate 101 is further treated to include a blanket passivation (electrically insulating) layer 215. In one embodiment, wafer processing apparatus 100 utilizes extrusion apparatus 110A (see FIG. 1) to form a doped region pattern similar to that described above with reference to FIG. 1. In another embodiment, wafer processing apparatus 100 utilizes the various techniques and structures described in the various specific embodiments set forth below. Once wafer processing is completed, passivation layer 215 is formed on upper surface 102 using known non-contact processing techniques. As referred to herein, the combined structure including substrate 101 and passivation layer 215 is generally as "wafer" or "device 201", and at each stage of the processing cycle is referenced with an appended suffix indicating the device's current processing stage (e.g., after formation of passivation layer 215 and prior to the ablation process described below, device 201 is referenced as "device 201T1", with the suffix "T1" indicating a relatively early point in the process cycle).

Device 201T1 is then subjected to various non-contact processes in order to produce a usable solar cell. First, a laser ablation apparatus 230 is utilized to define contact holes 217 through passivation layer 215 that expose corresponding portions of upper surface 102 of substrate 101 such that the contact holes are arranged in straight parallel rows over the doped diffusion regions. A suitable ablation process is described in additional detail in co-owned and co-pending U.S. patent application Ser. No. 11/562,383, filed Nov. 21, 2006, entitled "MULTIPLE STATION SCAN DISPLACEMENT INVARIANT LASER ABLATION APPARATUS", which is incorporated herein by reference in its entirety. After contact holes 217 are defined through passivation layer 215, partially processed wafers 201T2 are passed to a direct-write metallization apparatus 250 that is utilized to deposit contact structures 218 into contact holes 217, and to form metal interconnect lines 219 on passivation layer 215 such that each metal interconnect line 219 connects the contact structures 218 disposed over an associated doped diffusion region. Additional details and alternative embodiments related to direct-write metallization device 250 are disclosed in co-owned U.S. patent application Ser. No. 11/336,714, cited above. Finally, metallized device 201T3 is passed from direct-write metallization apparatus 250 to an optional post-metallization processing apparatus 270 for subsequent processing to form the completed solar cell 201T4.

Figure 3:
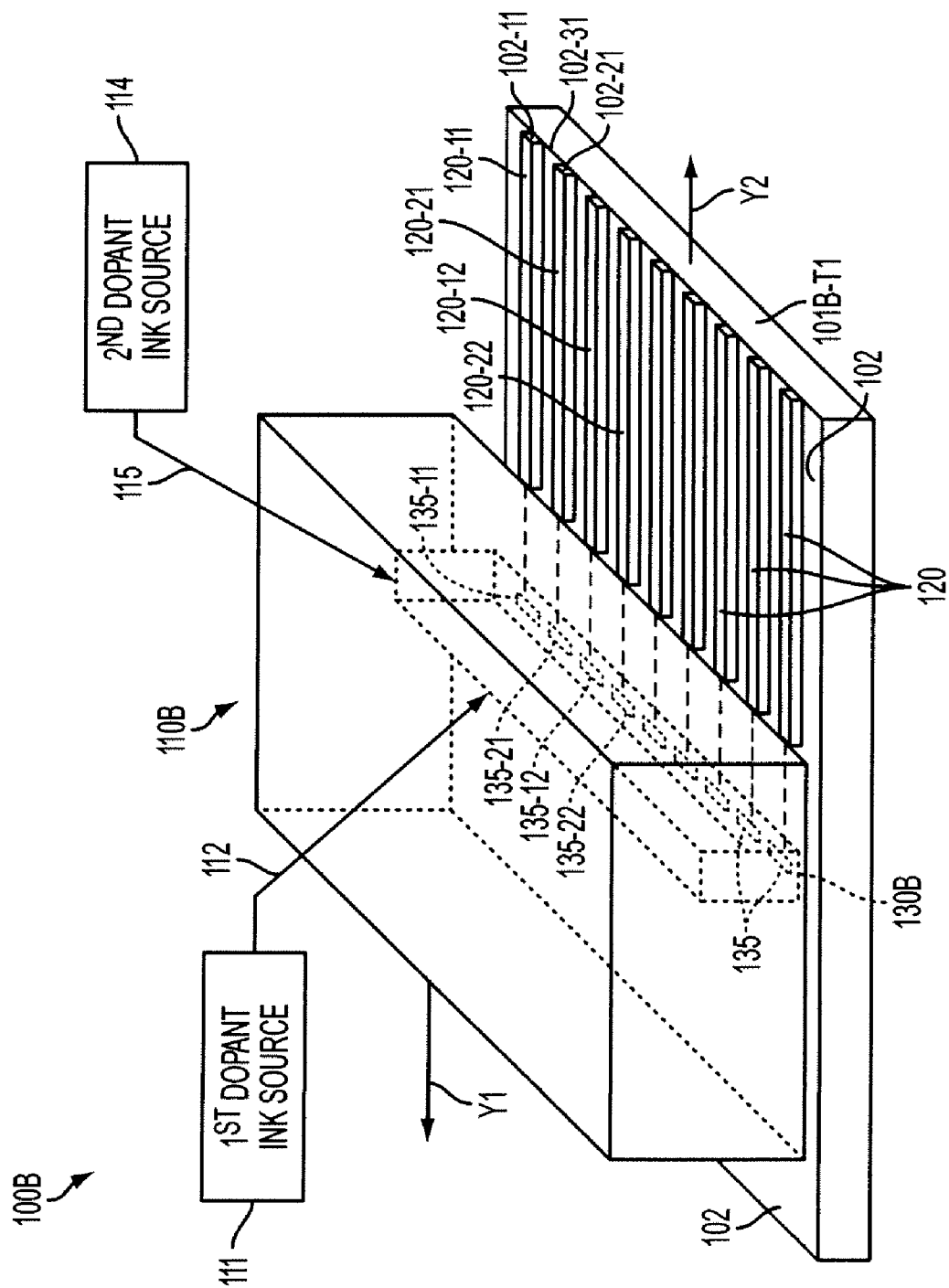
FIG. 3 is a simplified perspective view showing a multiple dopant ink extrusion apparatus of a wafer processing apparatus according to another embodiment of the present invention.

FIG. 3 is a simplified illustration showing the extrusion portion of a wafer processing apparatus 100B according to another embodiment of the present invention. Wafer processing apparatus 100B includes an extrusion apparatus 110B that supports an extrusion head 130B over a substrate 101B during the extrusion process. Wafer processing apparatus 100B differs from wafer processing apparatus 100 (described above) in that extrusion head 130B communicates with two dopant bearing material sources 111 and 114 containing two different dopant inks 112 and 115, and is capable of extruding dopant inks 112 and 115 such that they form extruded structures (lines) 120 in interdigitated arrangement onto semiconductor substrate 101B. In particular, as set forth in additional detail below, extrusion head 130B is formed such that dopant ink 112 is passed to a first set of outlet orifices 135 (e.g., outlet orifices 135-11 and 135-12), and dopant ink 115 is passed to a second, different set of outlet orifices 135 (e.g., orifice 135-21 and 135-22), where the first and second sets are alternately positioned along extrusion head 130B. With this arrangement, dopant ink 112 is deposited as extruded structures 120-11 and 120-12 and dopant ink 115 is deposited as extruded structures 120-21 and 120-22 in an interdigitated arrangement (i.e., such that extruded structure 120-21 is disposed between extruded structures 120-11 and 120-12).

In practical use, extrusion apparatus 110B operates similar to an inkjet printing apparatus to provide for the translation of substrate 101B-T1 with respect to the extrusion head 130B (i.e., either by moving extrusion head 130B in the direction Y1 over stationary substrate 101B, or by moving substrate 101B in the direction Y2 under stationary extrusion head 130B). Dopant inks 112 and 115 are fed into extrusion head 130B under pressure. Both applied fluid pressure and relative head-wafer motion are controlled by an automated system to produce lines 120 of controlled dimensions.

In accordance with an aspect of the present invention, a pitch of the interdigitated dopant ink lines 120 is controlled by the spacing between adjacent outlet orifices 135 that is designed into extrusion head 130B. For example, an exposed surface area 102-31, which is disposed between a first surface region 102-11 covered by extruded structure 120-11 and a second surface region 102-21 covered by extruded structure 120-21, has a width that is determined by a spacing between adjacent edges of outlet orifices 135-11 and 135-21. Because extrusion head 130B can be fabricated with precision machining methods, such as lithographic etching and wafer bonding, very high precision, on the order of microns, is achievable for the spacing between adjacent extruded structures 120. This novel approach to writing registered lines of dissimilar dopant inks exceeds all state of the art screen print methods.

Figure 4A:
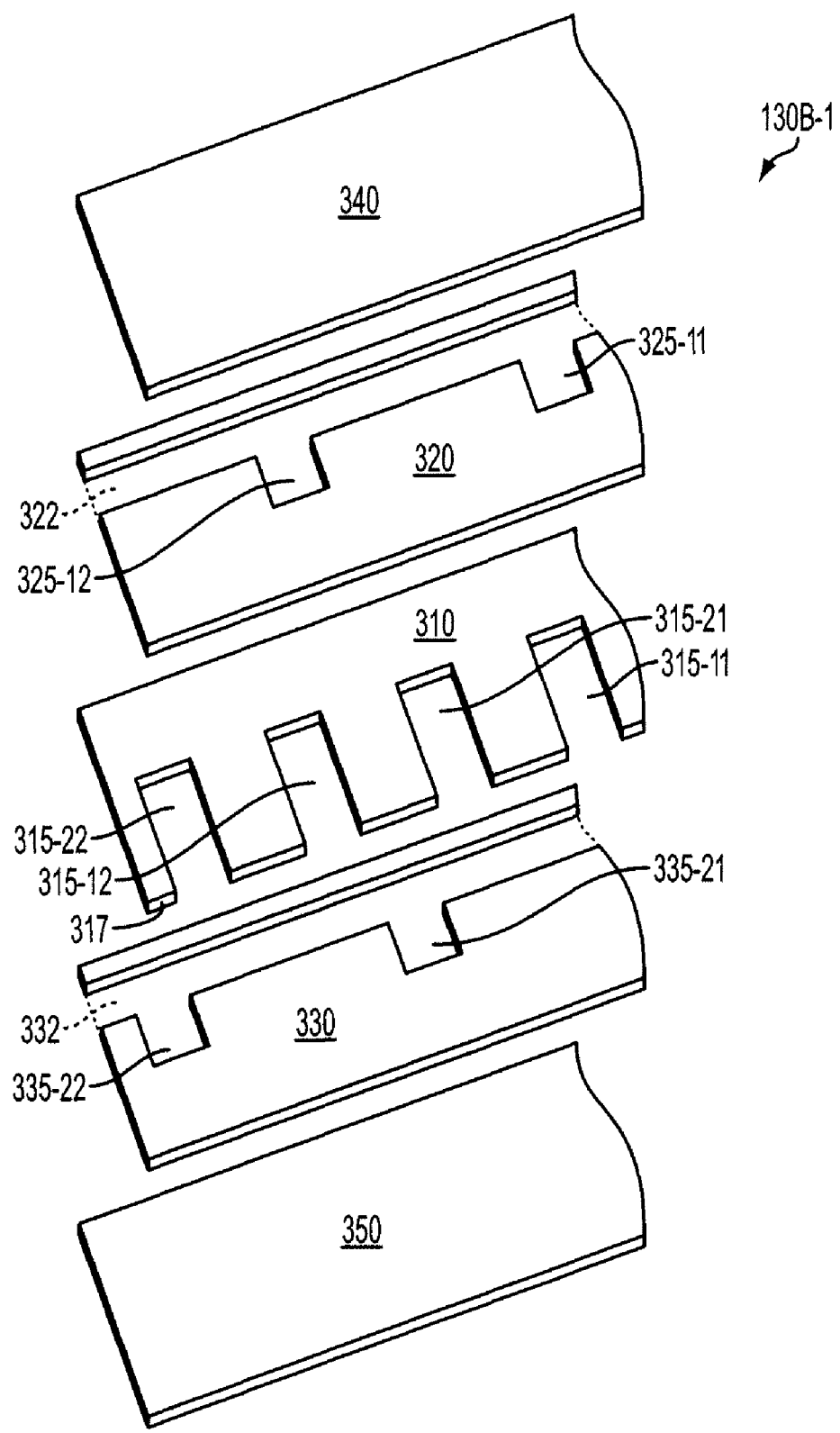
FIGS. 4(A) and 4(B) exploded and assembled perspective views, respectively, showing a portion of a multiple dopant ink extrusion head according to a specific embodiment of the present invention.
Figure 4B:
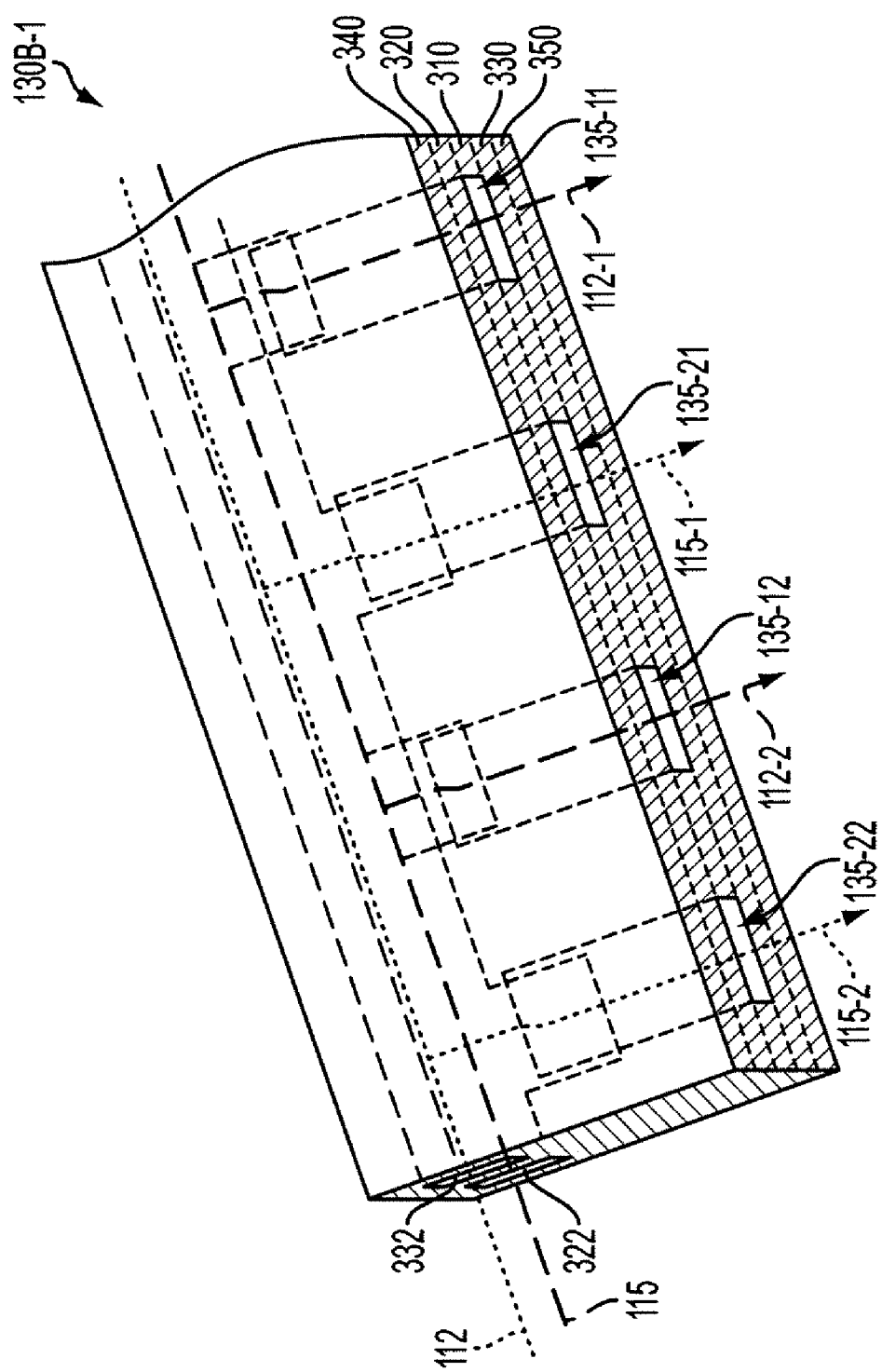

FIGS. 4(A) and 4(B) are exploded and assembled perspective views showing a portion of an extrusion head 130B-1 according to a specific embodiment of the present invention. Extrusion head 130B-1 includes a central sheet 310, upper and lower feedline sheets 320 and 330, and upper and lower capping sheets 340 and 350. Central sheet 310 is micromachined to include multiple parallel nozzle channels (e.g., nozzle channels 315-11, 315-12, 315-21 and 315-22), where each nozzle channel has a closed end and an opposing open end defined in side edge 317. Similarly, feedline sheets 320 and 330 are micromachined to include manifolds (plenums) and feed channels that are arranged to transfer dopant ink to corresponding nozzles of central sheet 310. For example, feedline sheet 320 includes a plenum 322 that extends in a direction perpendicular to the nozzle channels, and includes feed channels 325-11 and 325-12 that communicate with plenum 322 and extend over the closed ends of nozzle channels 315-11 and 315-12, respectively. Similarly, feedline sheet 330 includes a plenum 332 and feed channels 335-21 and 335-22 that extend over the closed ends of nozzle channels 315-21 and 315-12, respectively.

In accordance with an aspect of the present invention, extrusion head 130B-1 is produced using materials that do not introduce unwanted impurities, particularly impurities that would induce carrier recombination. Materials such as polytetrafluoroethylene (PTFE) and other chemically inert polymer materials or glass or silicon are preferred materials for constructing the extrusion head. It is important to dispense dopant ink 112 and 115 without the introduction of harmful impurities. Transition metal and other metal impurities are in particular to be avoided. These include gold, copper, iron etc. This makes the use of ferrous metal-based fluidic systems undesirable. In a preferred embodiment, sheet layers 310 to 350 are fabricated using micromachined silicon. As indicated in FIG. 4(B), sheet layers 310 to 350 are then stacked and bonded using known techniques to complete extrusion head 130B-1.

As indicated by the dashed lines in FIG. 4(B), during operation first dopant ink 112 is transmitted along plenum 322, and is forced through feed channels 322-11 and 322-12 into nozzle channels 315-11 and 315-12 (FIG. 4(A)), and thus exits through outlet orifices 135-11 and 135-12 as dopant ink beads 112-1 and 112-2. Similarly, dopant ink 115 is transmitted along plenum 332, and is forced through feed channels 332-21 and 332-22 into nozzle channels 315-21 and 315-22 (FIG. 4(A)), and thus exits through outlet orifices 135-21 and 135-22 as dopant ink beads 115-1 and 115-2.

FIGS. 5(A) to 5(G) illustrate various process steps for fabricating an IBC solar cell device using system 200 (FIG. 2) and extrusion head 130B-1 (FIGS. 4(A) and 4(B)).

Figure 5A:
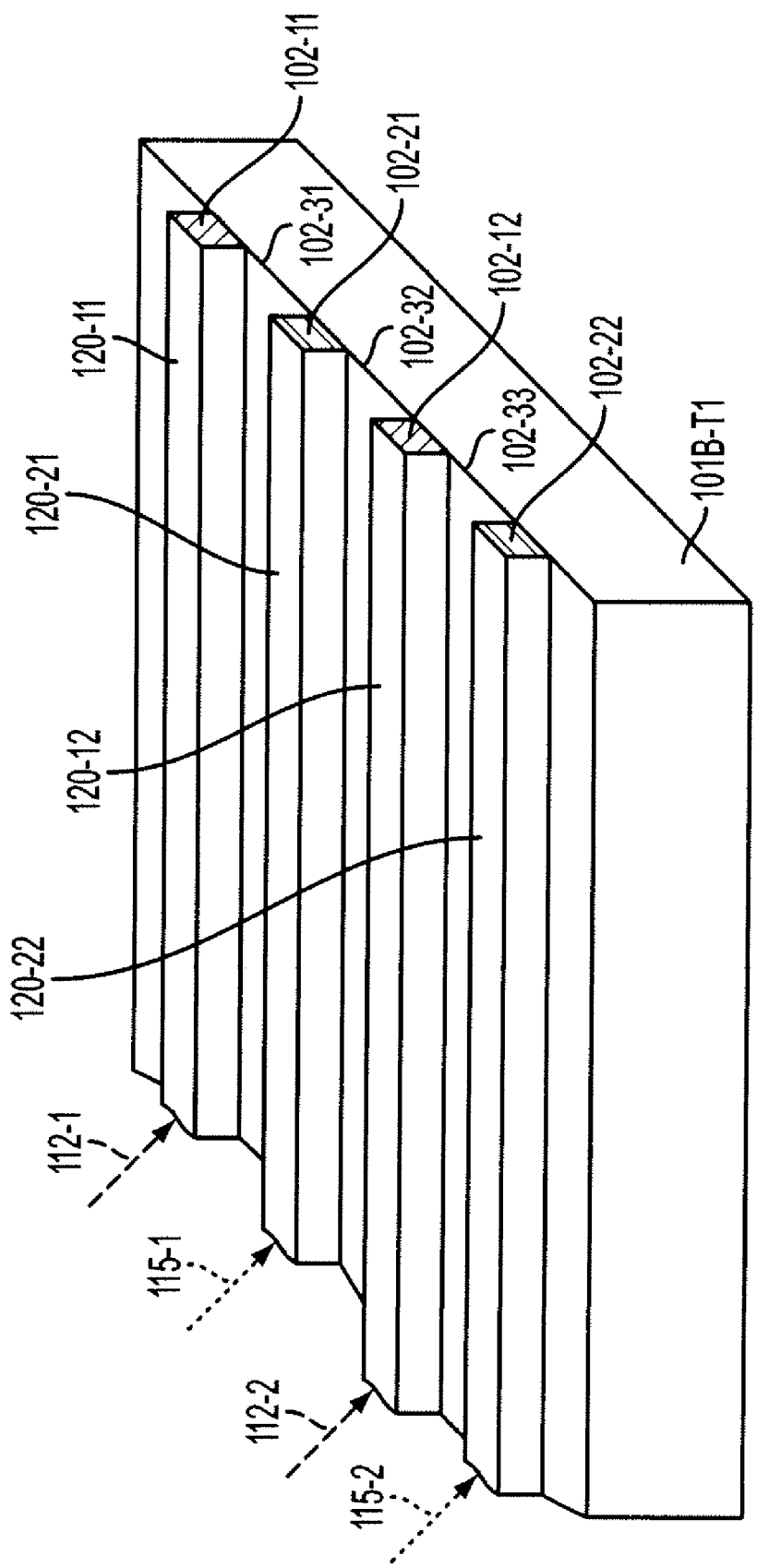
FIGS. 5(A), 5(B), 5(C), 5(D), 5(E), 5(F) and 5(G) are perspective views illustrating various process stages during the fabrication of an IBC solar cell device using the system of FIG. 2 and extrusion head of FIG. 4(B) according to another embodiment of the present invention.

FIG. 5(A) shows extruded structures 120-11, 120-21, 120-12 and 120-22 that are respectively formed by dopant ink beads 112-1, 115-1, 112-2 and 115-2 (see FIG. 4 (B)). Extruded structures 120-11, 120-21, 120-12 and 120-22 are respectively disposed on surface areas 102-11, 102-21, 102-12 and 102-22 of substrate 101-B1 such that adjacent pairs of extruded structures are respectively separated by corresponding exposed surface areas 102-31, 102-32 and 102-33. In one embodiment, extruded structures 120-11, 120-21, 120-12 and 120-22 are relatively narrow in comparison to exposed surface areas 102-31, 102-32 and 102-33. In this embodiment, dopant ink 112 includes a p-type dopant and dopant ink 115 includes an n-type dopant.

Figure 5B:
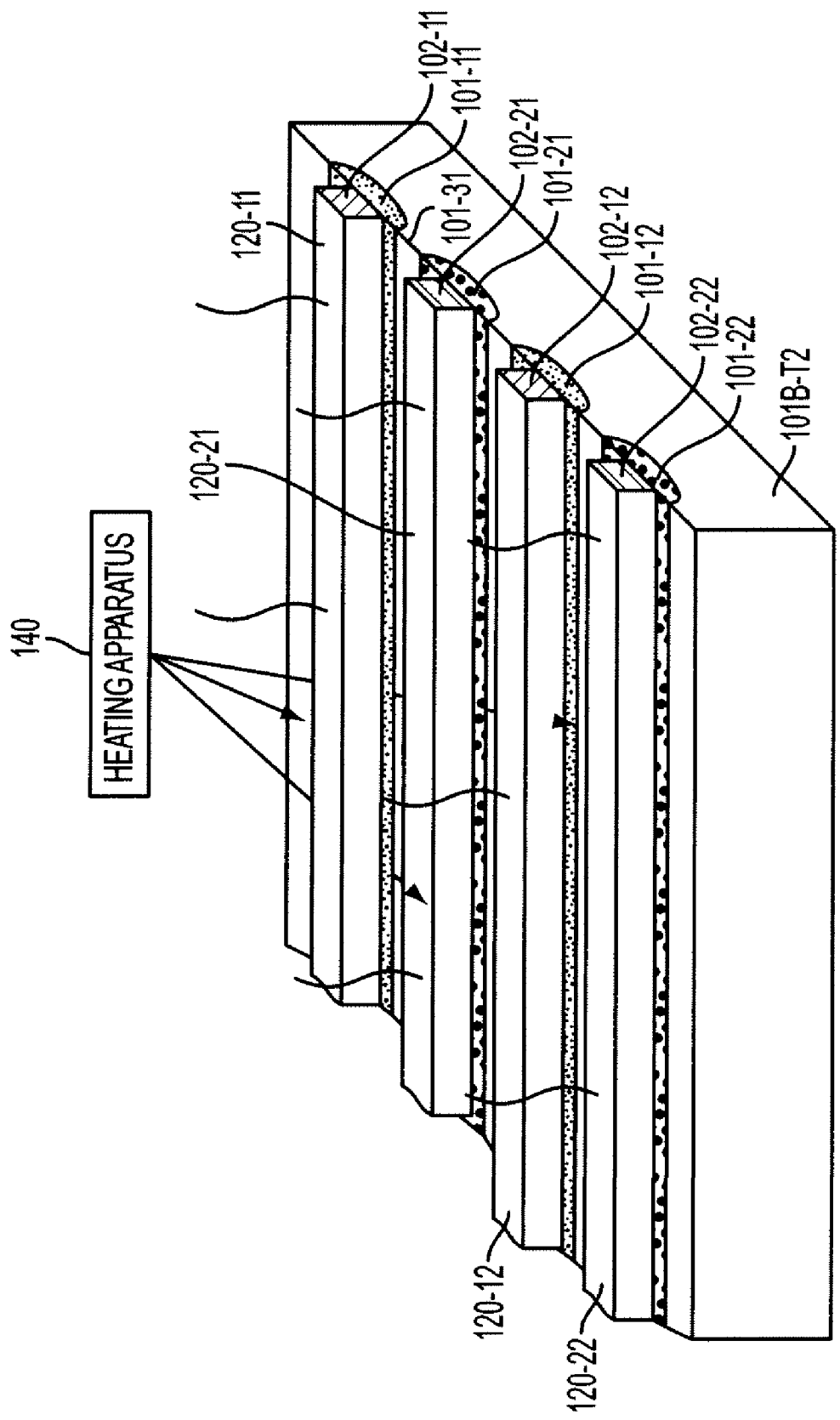

FIG. 5(B) shows substrate 101B-T2 during a subsequent heating process using thermal processing apparatus 140, whereby dopant from each of extruded structures 120-11, 120-21, 120-12 and 120-22 is diffused into substrate 101B-T2. Specifically, the p-type dopant contained in dopant ink 112 diffuses through surface areas 102-11 and 102-12 to form p-type (first) doped regions 101-11 and 101-12. Similarly, the n-type dopant contained in dopant ink 115 diffuses through surface areas 102-21 and 102-22 to form n-type (second) doped regions 101-11 and 101-12. Note that each p-type doped region (e.g., doped region 101-11) is separated from all other p-type doped regions (e.g., doped region 101-12) by at least one n-type doped region (e.g., doped region 101-21). In addition, each doped region (e.g., doped region 101-11) is separated from its adjacent neighboring doped regions (e.g., doped region 101-21) by an undoped (intrinsic) or lightly doped region of substrate 101B-T2 (e.g., region 101-31). As discussed above, this alternating arrangement of p-type doped regions and n-type doped regions is conducive to the fabrication of IBC type solar cells.

Figure 5C:
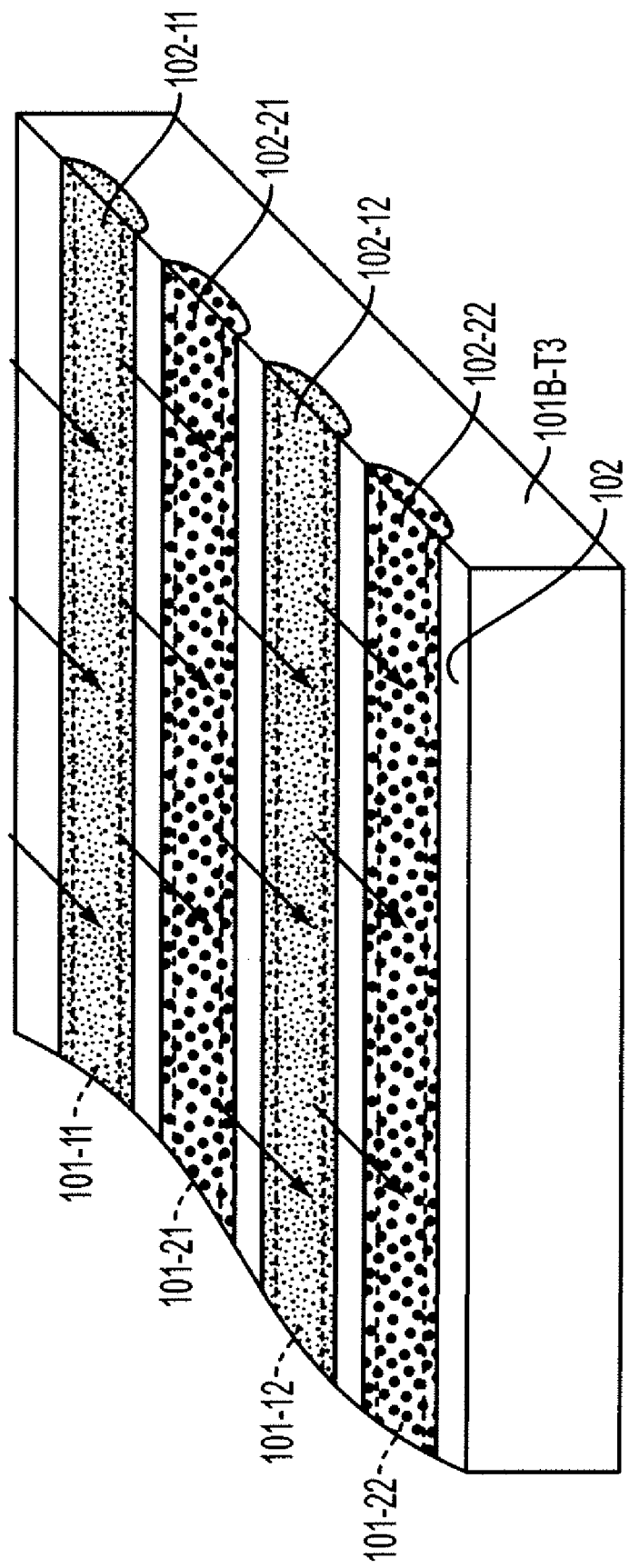

FIG. 5(C) depicts an optional process of removing residual dopant ink from surface areas 102-11, 102-21, 102-12 and 102-22 of substrate 101-T3 after the heating/diffusion process is completed. This ink removal step may be avoided by utilizing dopant inks having vehicles that burn off during the heating/diffusion process. Note that each of the doped diffusion regions 101-11, 101-21, 101-12 and 101-22 extends to surface areas 102-11, 102-21, 102-12 and 102-22.

Figure 5D:
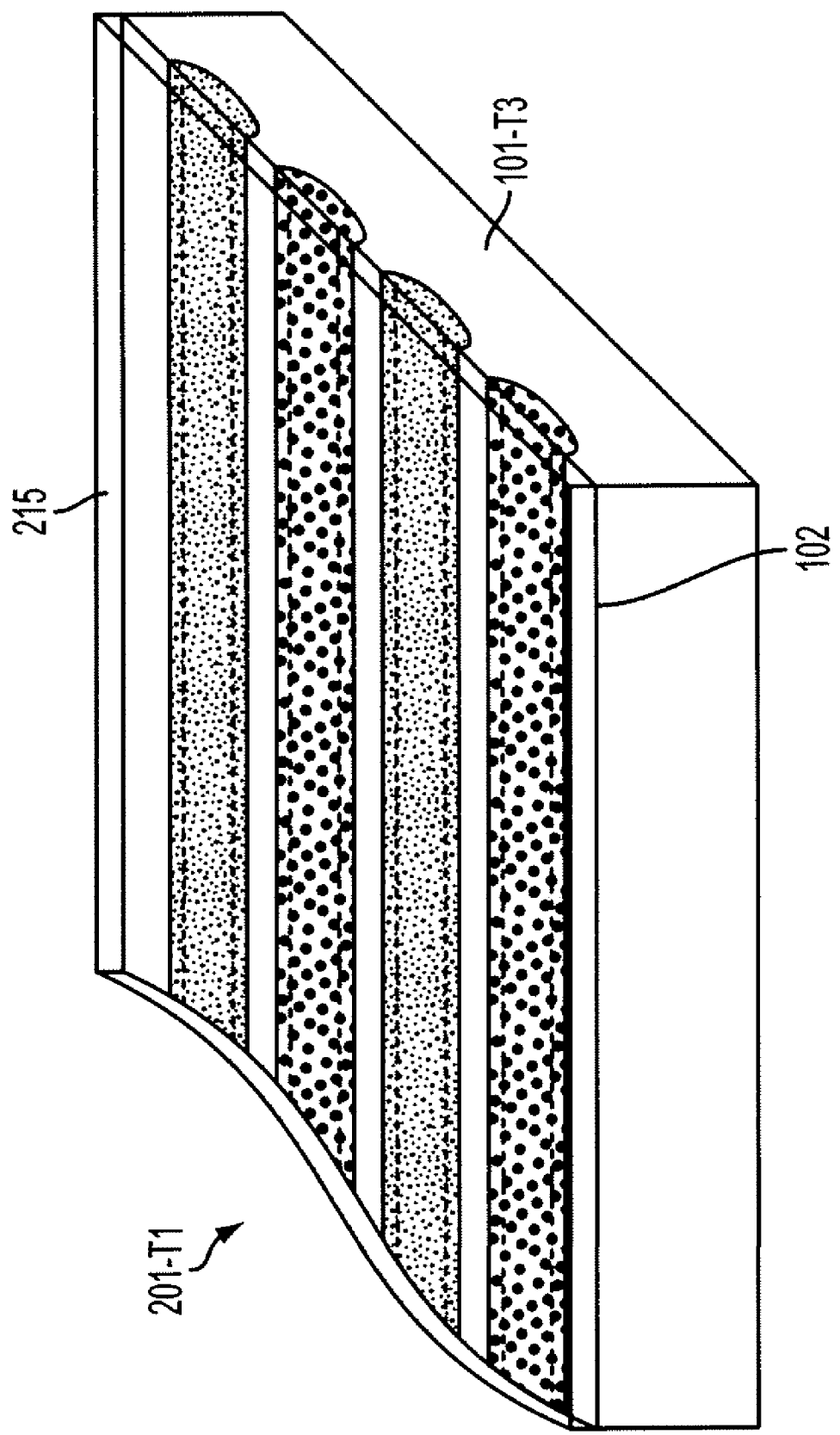

FIG. 5(D) illustrates the subsequent formation of a passivation layer 215 on upper surface 102 of substrate 101-T3, thereby providing partially formed device 201-T1 (described above with reference to FIG. 2).

Figure 5E:
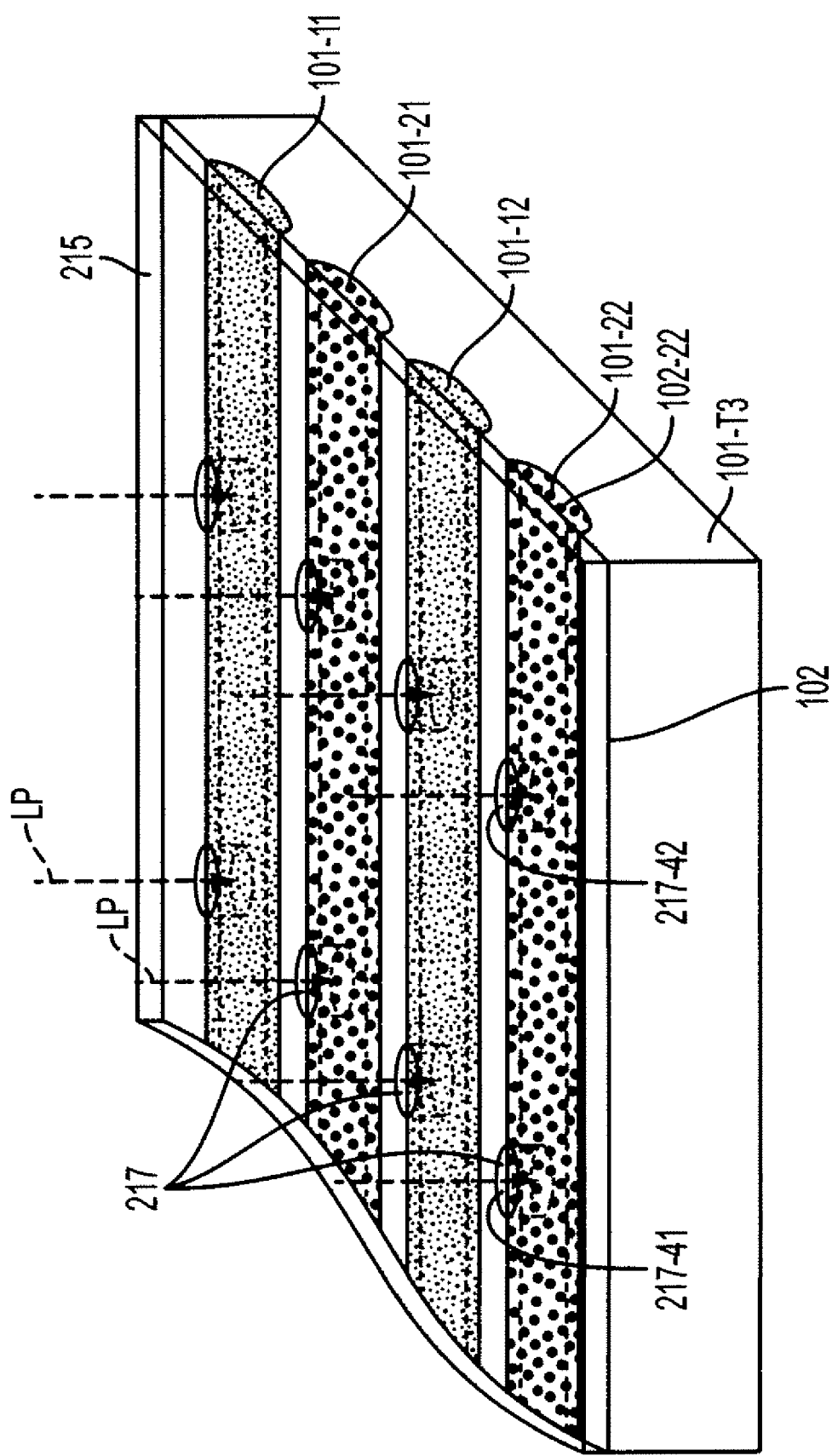

FIG. 5(E) illustrates a subsequent laser ablation process during which laser pulses LP are used to remove portions of passivation layer 215 such that contact openings 217 are defined that expose portions of surface 102 disposed over doped regions 101-11, 101-21, 101-12 and 101-22. For example, contact openings 217-41 and 217-42 extend through passivation layer 215 to corresponding portions of surface area 102-22, which as described above is disposed over doped region 101-22. Similarly, contact openings 217 are formed that extend through passivation layer 215 to surface areas disposed over doped regions 101-11, 101-21, and 101-12. The laser ablation process is performed using laser ablation apparatus 230, which is described above with reference to FIG. 2.

Figure 5F:
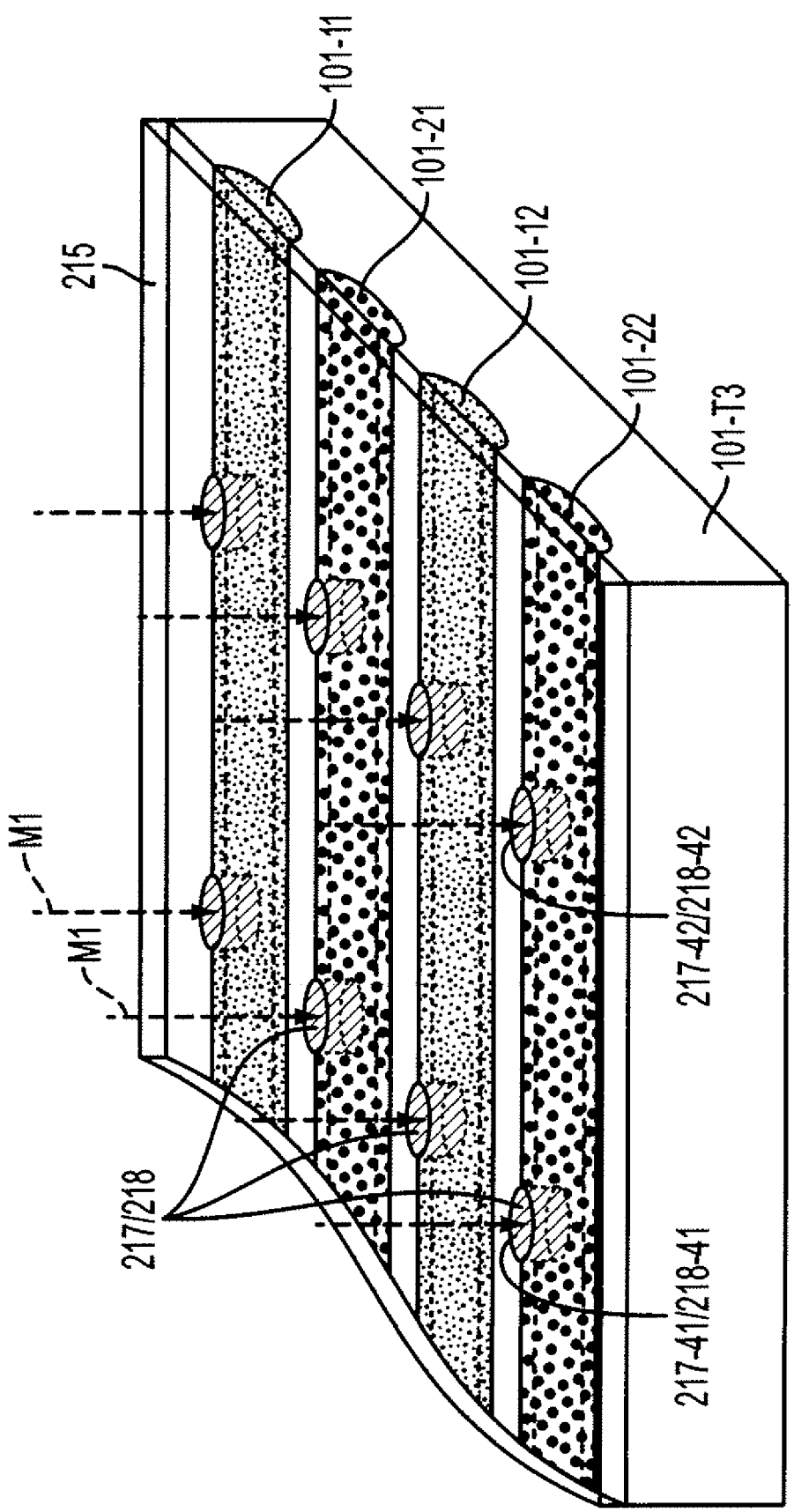

FIG. 5(F) depicts the sequential deposition of contact material M1 from direct-write metallization apparatus 250 (FIG. 2) into each opening 217 formed in passivation layer 215 such that contact structures 218 are formed directly on exposed portions of substrate 101. For example, contact structures 218-41 and 218-42 are inserted into contact openings 217-41 and 217-42, respectively, and contact portions of surface 102 that are disposed over doped region 101-22. Similarly, contact structures 218 are formed in each contact opening 217 disposed over doped regions 101-11, 101-12, and 101-21.

Figure 5G:
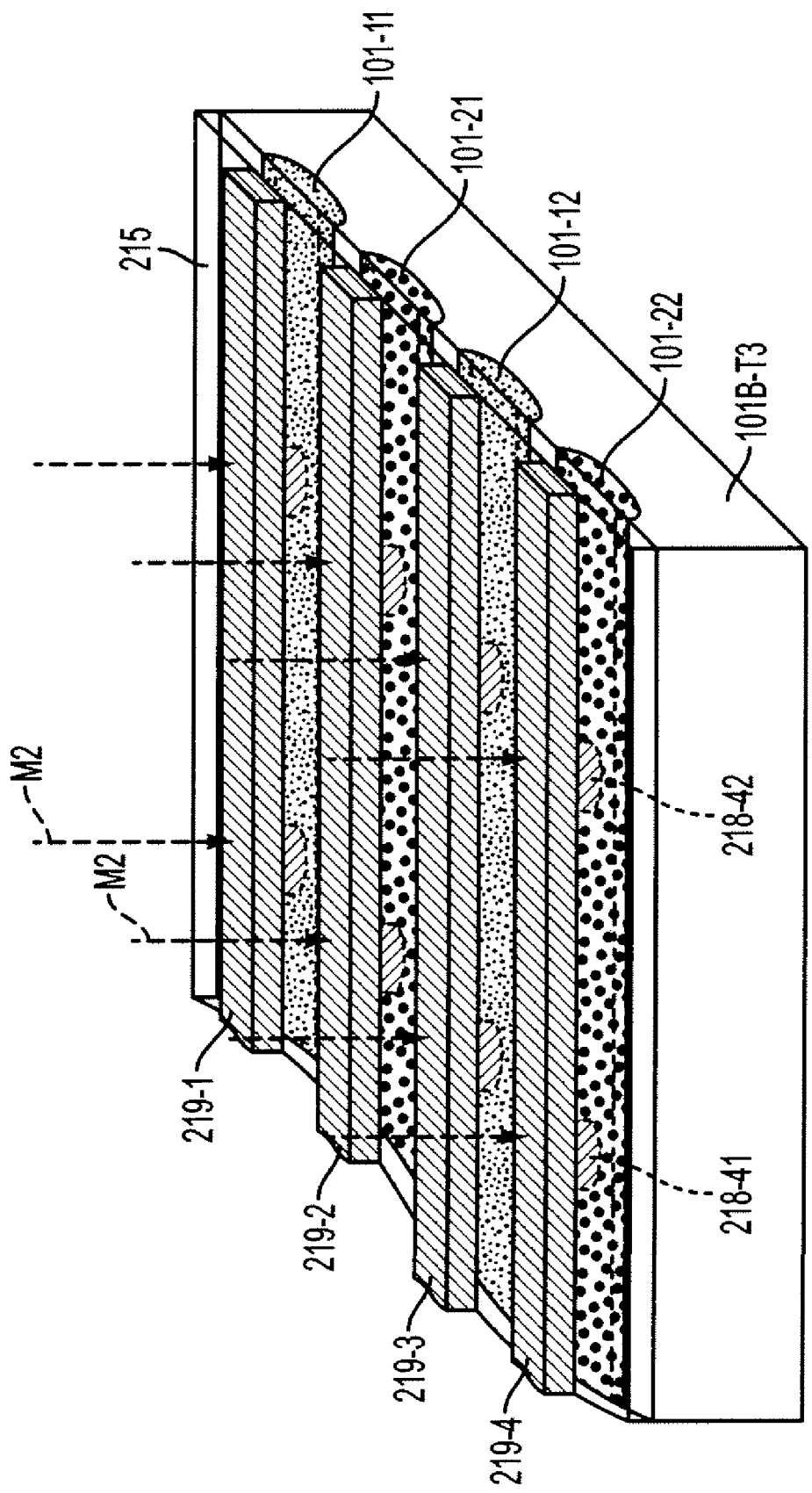

FIG. 5(G) illustrates a subsequent process of depositing metal material M2 in a manner that forms metal line structures 219-1 to 219-4 on an upper surface of passivation layer 214 such that each metal line structure contacts a group contact structures that are disposed over a corresponding one of doped regions 101-11, 101-12, 101-21 and 101-22. For example, metal line structure 219-4 contacts the upper end of contact structures 218-41 and 218-42, whereby an electrical connection is provided between doped region 101-22 and metal line structure 219-4 by way of contact structures 218-41 and 218-42. Similarly, each of metal line structures 219-1, 219-2 and 219-3 are electrically connected to doped regions 101-11, 101-21 and 101-12 by way of corresponding contact structures. The metal line formation process is also performed using direct-write metallization apparatus 250, which is described above with reference to FIG. 2.

With additional layers containing feed-thru holes and optional additional plenums, it is possible to provide a means for interdigitated dispense from one side of an extrusion head, and also optionally provide means for dispensing three or more materials in arbitrary or repeating patterns. Providing the inlets on one side of the extrusion head makes it possible to operate the extrusion head over a wider range of angles relative to the substrate, including the so-called "side shooting" mode in which the extruded material stream exits the extrusion head nearly parallel to the substrate.

Figure 6:
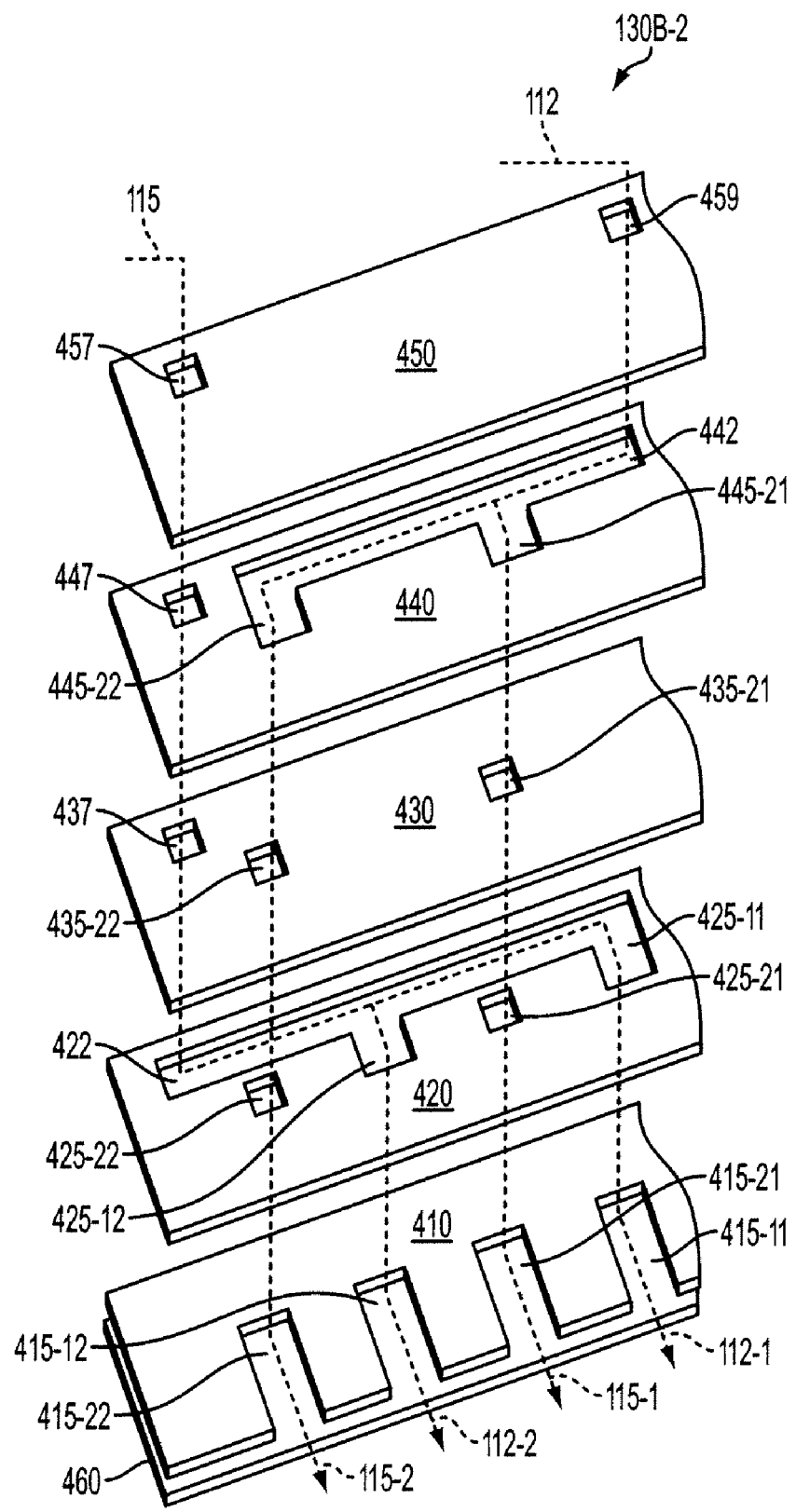
FIG. 6 is an exploded perspective view showing a portion of a multiple dopant ink extrusion head according to another exemplary embodiment of the present invention.

FIG. 6 is an exploded perspective view showing a portion of an extrusion head 130B-2 according to an exemplary embodiment of the present invention that utilizes six layers containing feed-thru holes to facilitate the formation of interdigitated extruded structures from one side of extrusion head 130B-2. Extrusion head 130B-2 includes a lower sheet 410, a first feedline sheet 420, a first feed-thru sheet 430, a second feedline sheet 440, an upper feed-thru sheet 450, and a lower capping sheet 460. Lower sheet 410 includes multiple parallel nozzle channels 415-11, 415-12, 415-21 and 415-22 formed in the manner described above with reference to FIG. 4(A). First feedline sheet 420 includes a first plenum 422 and feed channels 425-11 and 425-12 that are aligned with corresponding nozzles 415-11 and 415-12 of first sheet 410. In addition, feedline sheet 420 includes feed holes 425-21 and 425-22 that are aligned with corresponding nozzles 415-21 and 415-22 of first sheet 410. First feed-thru sheet 430 includes first and second feed holes 435-21 and 435-22 that are respectively aligned with feed holes 435-21 and 435-22 of first feedline sheet 420, and a third feed hole 437 that is aligned with plenum 422. Second feedline sheet 440 includes a second plenum 442 and feed channels 445-21 and 445-22 that are respectively aligned with first and second feed holes 435-21 and 435-22 of first feed-thru sheet 430. Upper feed-thru sheet 450 includes a first feed hole 457 that is aligned with feed hole 447 of sheet 440, and a second feed hole 459 that is aligned with plenum 442 of sheet 440.

As indicated by the dashed lines in FIG. 6, during operation first dopant ink 112 is transmitted through feed holes 457, 447 and 437 to plenum 422, and exits plenum 422 through feed channels 425-11 and 425-12 into nozzle channels 415-11 and 415-12, and then exits from nozzle channels 415-11 and 415-12 as dopant ink beads 112-1 and 112-2. Similarly, second dopant ink 114 is transmitted through feed hole 459 to plenum 442. A first portion of dopant ink 114 and exits plenum 442 through feed channel 445-21 and feed holes 435-21 and 425-21 into nozzle channel 415-21, and then exits from nozzle channel 415-21 as dopant ink bead 114-1. A second portion of dopant ink 114 and exits plenum 442 through feed channel 445-22 and feed holes 435-22 and 425-22 into nozzle channel 415-22, and then exits from nozzle channel 415-22 as dopant ink bead 114-2. Dopant ink beads 112-1, 112-2, 114-1 and 114-2 form extrusion structures similar to those shown in FIG. 5 (A).

In another variation of the present invention, at least one type of dopant ink is dispensed together with a non-doping ink. This non-doping ink may serve as a spacer between dopant ink structures and/or as barrier to prevent doping from the ambient. It may be desirable for device performance reasons to have stripes of heavily n-type and p-type doped material separated by intrinsic or lightly doped semiconductor. This is achievable by providing a poly-extrusion head that simultaneously delivers three types of ink, each one bearing a different composition of dopant, or no dopant at all.

Figure 7:
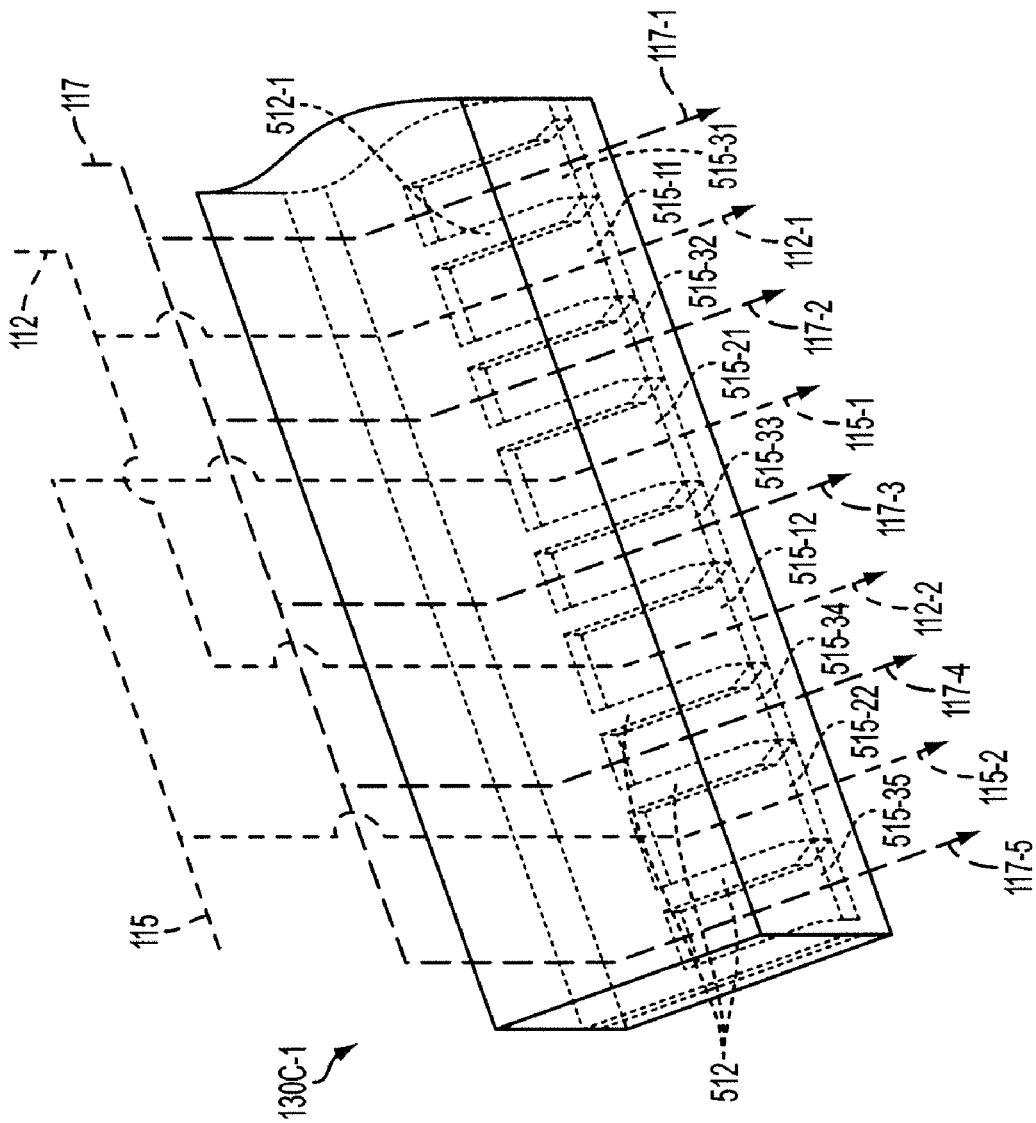
FIG. 7 is a simplified perspective view showing a poly-extrusion head according to another exemplary embodiment of the present invention.

FIG. 7 is a simplified perspective view showing a poly-extrusion head 130C-1 according to another embodiment of the present invention. The nozzle channel layer of poly-extrusion head 130C-1 is depicted in dashed lines for illustrative purposes, but feed channels, feed holes and plenums, which are formed in the manner described above, are omitted from the figure for clarity. Similar to previously described embodiments, dopant ink 112 is dispensed from nozzles 515-11 and 515-12, and dopant ink 115 is dispensed from nozzles 515-21 and 515-22. However, in this example a non-doping ink 117 is dispensed from nozzles 515-31 to 515-35 that are respectively disposed between adjacent pairs of nozzles 515-11, 515-12, 515-21 and 515-22. For example, nozzle 515-32 is disposed between nozzles 515-11 and 515-21. In a practical device for solar cell doping, the pitch of the dopant sources may vary from 100 microns to several millimeters. For typical wafer sizes, this implies a quantity of nozzles on the order of 100 to 1000, far more than illustrated by the exemplary embodiments described herein. By virtue of the manifold configuration, as illustrated in FIG. 8, extruded structures 120-31 to 120-35 are respectively formed by beads 117-1 to 117-5 such that non-doping material is disposed on each side of each dopant bearing extrusion structure 120-11, 120-21, 120-12 and 120-22.

Figure 8:
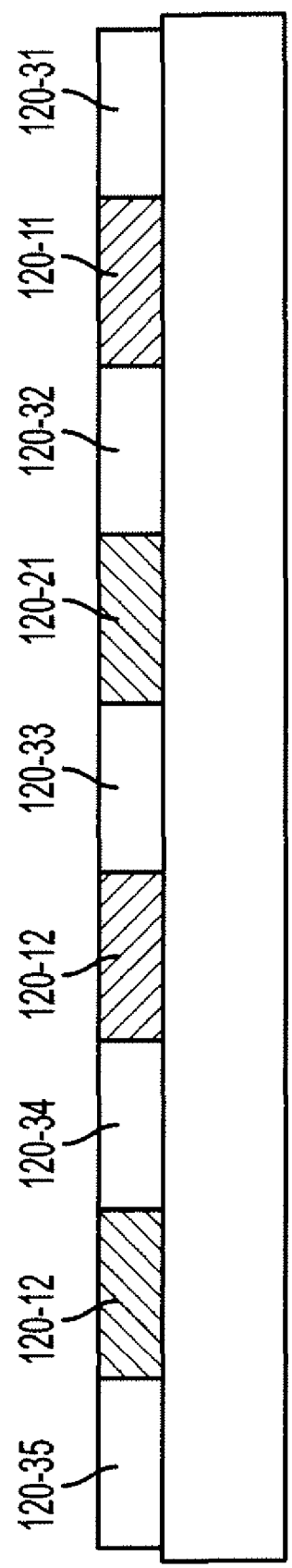
FIG. 8 is a cross-sectional end view showing an exemplary extruded structure formed by the poly-extrusion head of FIG. 7.

In accordance with another aspect of poly-extrusion head 130C-1, the various nozzles merge the flow of ink into a continuous sheet of interleaved materials, which is depicted in FIG. 8. That is, extrusion structures formed from non-doping material extend between the side edges of each adjacent pair of doped extrusion structures (e.g., non-doping structure 120-32 extends between corresponding side edges of (first) extruded structure 120-11 and (second) extruded structure 120-21). To achieve this convergence, the nozzles are formed using tapered fingers 512, which are shown in FIG. 7. The taper of the nozzle outlet orifices is designed such that the material is extruded with laminar flow and minimal mixing. In this embodiment, the relative widths of the ink flows are substantially equal. In other embodiments it is desirable to produce very narrow doped extruded structures embedded between relatively wide lines of non-doping material.

Figure 9:
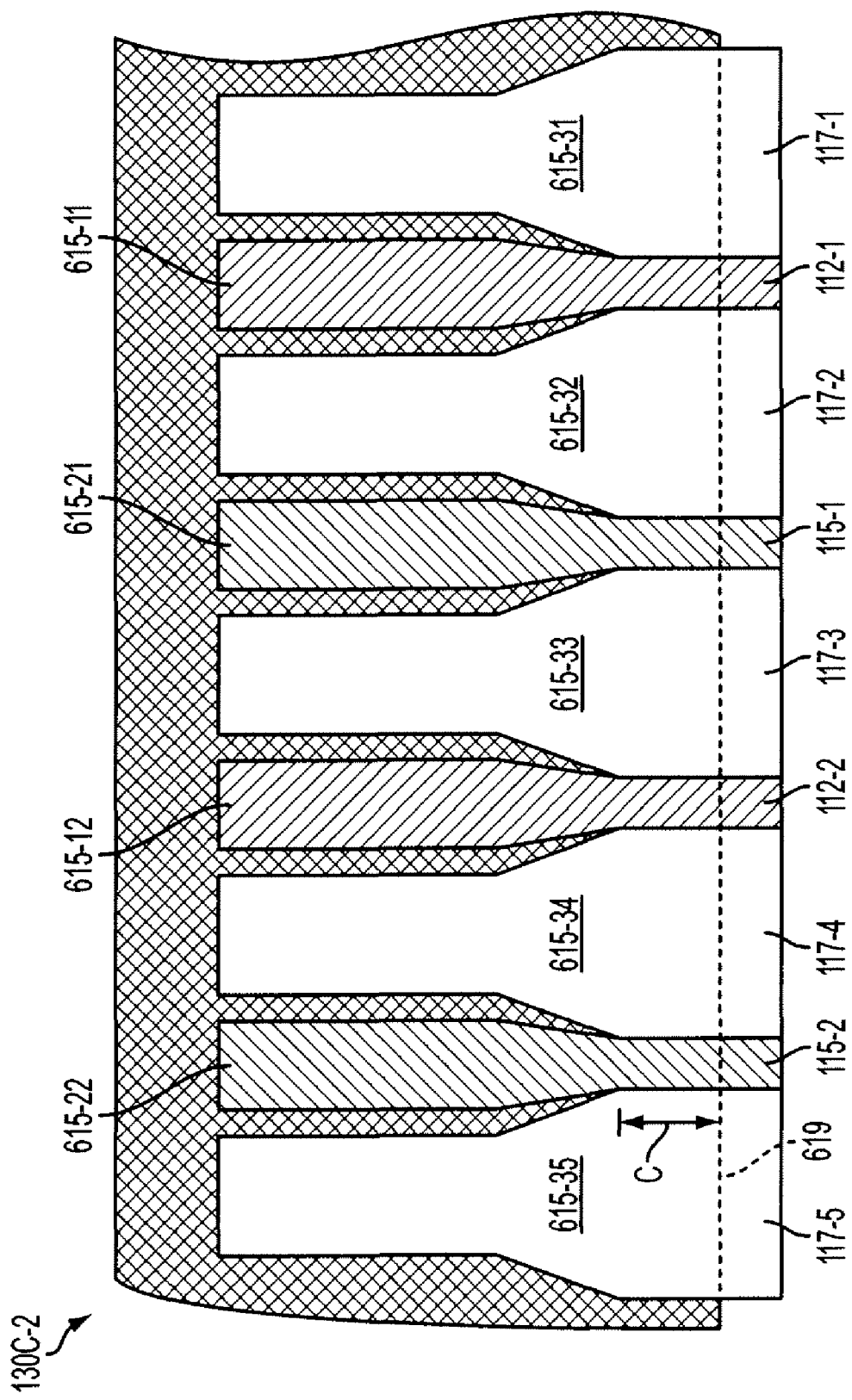
FIG. 9 is a simplified cross-sectional top view showing a poly-extrusion head according to another exemplary embodiment of the present invention.

FIG. 9 is a simplified cross-sectional top view showing a poly-extrusion head 130C-2 according to another embodiment of the present invention. The nozzle channel layer of poly-extrusion head 130C-2 is depicted in cross-section for illustrative purposes (other features are omitted for clarity). Poly-extrusion head 130C-2 is characterized by converging nozzles 615-11, 615-12, 615-21 and 615-22 having tapered nozzle walls that create the useful embedding of compressed, relatively narrow dopant bearing beads 112-1, 112-2, 115-1 and 115-2 interleaved between wider beads 117-1 to 117-5 of a non-doping or lightly doped material. Note that the end of converging nozzles 615-11, 615-12, 615-21 and 615-22 are set back from head end facet 619 by a distance C. The resulting internal space within extrusion head 130C-2 between the end of the individual nozzles and head end facet 619 provides for the further compressing and narrowing of the dopant bearing material prior to leaving extrusion head 130C-1, and subsequent deposition on a substrate. Full control of the line width is both a function of the extrusion head design as well as the relative flow rates of the materials.

An application in which extrusion head 130C-2 is particularly useful is the writing of lines of heavily doped semiconductor fingers on to a surface of a solar cell. These semiconductor fingers serve to provide a low resistance path for carriers from the surface of the cell to the gridlines of the cell. Inclusion of these fingers improves cell performance in several ways including enabling a lightly doped emitter layer without a large resistive loss penalty, improving the blue photo-response of the cell, reducing the contact resistance, and allowing gridlines to be spaced farther apart, thereby decreasing light shadowing.

In current practice, the incorporation of semiconductor fingers into the emitter of a solar cell requires additional process steps, and therefore, added cost. Typically, the cells are first processed in a phosphorous diffusion reactor to produce a lightly doped emitter as with conventional cells, and then three steps are added: (1) laser writing of trenches in the silicon (2) a damage etch and (3) an additional phosphorous diffusion step. In a useful improvement on this process, the light and heavy doping sources are applied simultaneously in a single extrusion operation, thereby eliminating the three additional process steps. In a preferred method embodiment, the relatively narrow lines are a heavily doping ink, and the relatively wider lines are a lightly doping ink. Semiconductor fingers may be applied to one or to both sides of the semiconductor wafer. If both sides are patterned, the thermal treatment to drive in the dopant may be performed in a single step.

Figure 10:
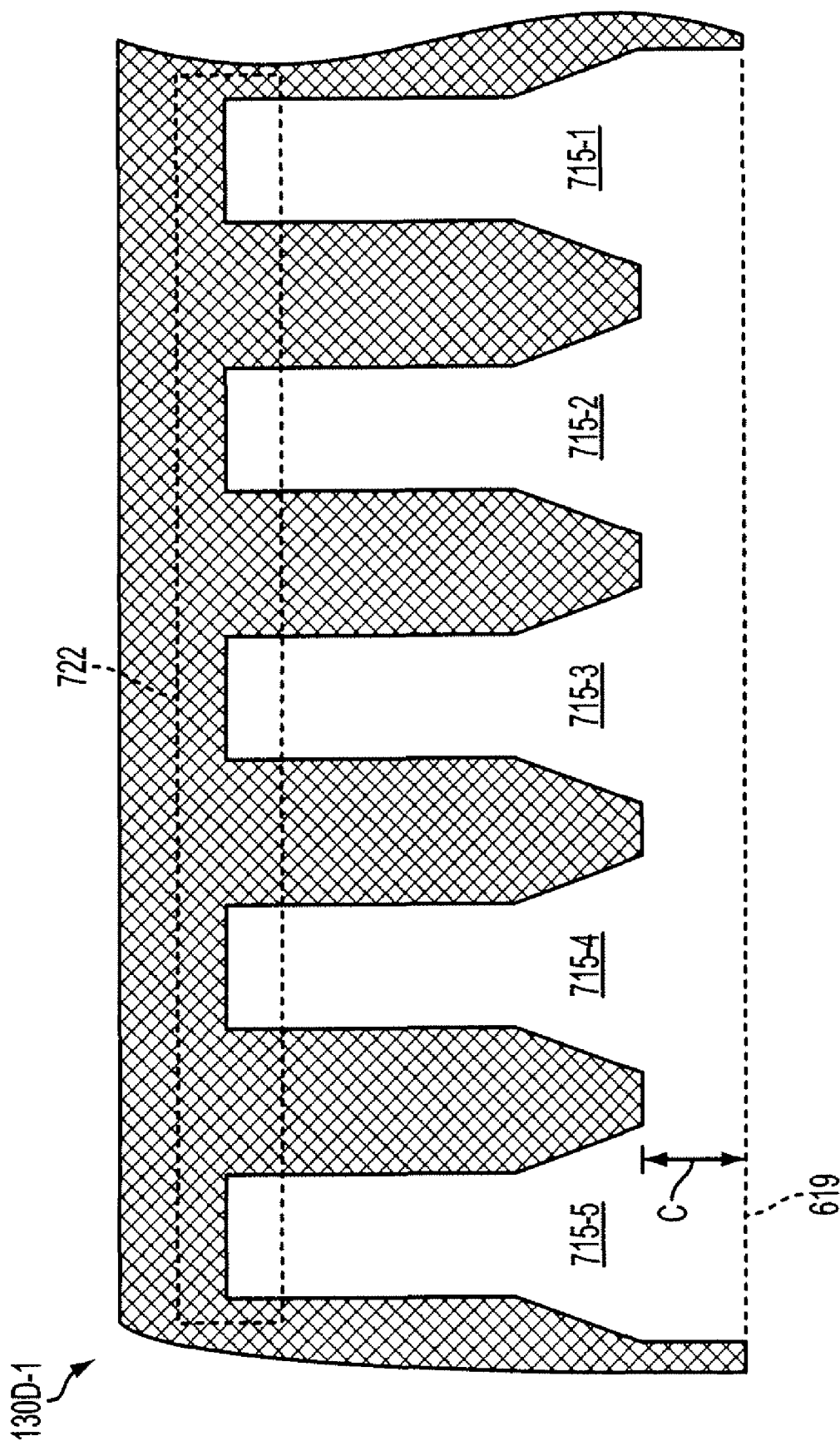
FIG. 10 is a simplified cross-sectional top view showing a portion of an extrusion head for generating a wide sheet of dopant ink according to another exemplary embodiment of the present invention.

FIG. 10 illustrates another extrusion head 130D-1 that includes a single plenum 722 feeding several nozzle channels 715-1 to 715-5 that diverge and terminate before end facet 719 in the manner described above with reference to FIG. 9, thereby generating a flow merging section that produces a uniform extruded sheet of dopant or metal paste. The ink enters into and spreads throughout plenum 722, at which point in encounters separated nozzle channels 715-1 to 715-5. Nozzle channels 715-1 to 715-5 add flow impedance, which ensures that even if the ink is fed into the plenum from a single point, the flows through each channel are substantially equal. This head can be used for example to write on a broad area of the solar cell with metal or dopant in a non-contact fashion, thereby avoiding wafer breakage that is risked using conventional screen printing techniques. It can also be used to write lines of intermediate width, such as the bus bar metallization illustrated above. In an alternative embodiment, two structures similar to that illustrated in FIG. 10 are mounted in a stacked arrangement with a separation layer therebetween, and two or more material layers (e.g., a dopant ink and a metal paste line) are simultaneously respectively extruded from the two structures in a vertical stacked arrangement.

Figure 11:
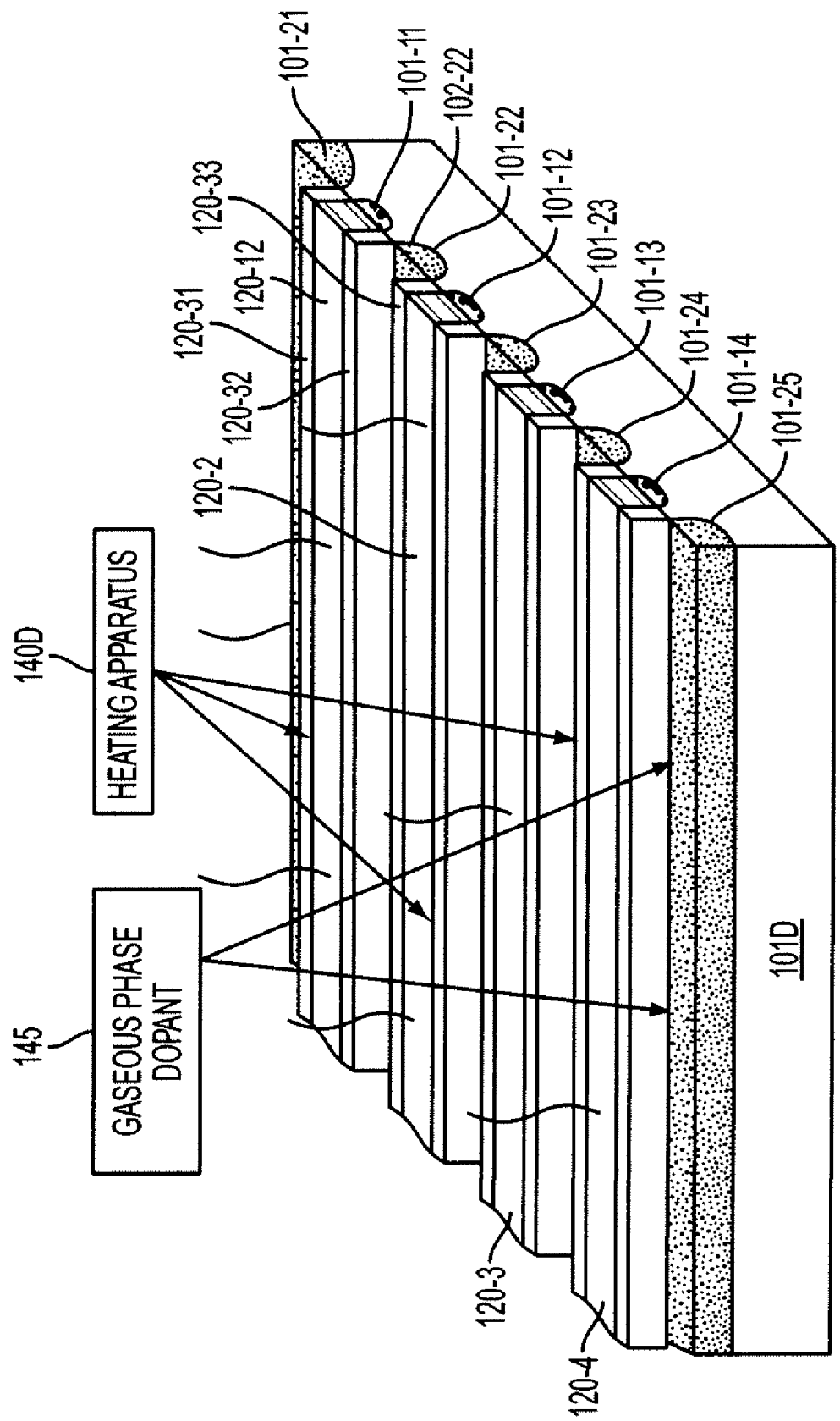
FIG. 11 is a simplified perspective view illustrating a hybrid doping method according to another embodiment of the present invention.

FIG. 11 depicts a hybrid doping method according to another embodiment of the present invention that uses a combination of solid source doping (i.e., doping using a dopant ink) and gas phase doping. In the example depicted in FIG. 11, dopant ink structures 120-1 to 120-4 are formed on substrate 101D in the manner described above, and non-doping structures are formed on each side of an associated doping structure 120-1 to 120-4 (e.g., non-doping structures 120-31 and 120-32 are formed on opposite sides of doping structure 120-1). In addition, selected surface areas 102-31 to 102-35 are intentionally exposed between the extruded structures. For example, a gap between non-doping structures 120-32 and 120-33 provides exposed upper surface area 102-22. In this embodiment, a temperature anneal of substrate 101D is performed in a phosphorous (n-type doping) ambient 145, and p-type dopant ink structures 120-1 to 120-4 (e.g., a boron bearing paste) are used. The thermal processing in conjunction with doping ambient 145 will result in both solid source doping in regions 101-11 to 101-14 and ambient source doping in regions 101-21 to 101-25 of substrate 101D. It is a further aspect of this invention that dopant ink structures 120-1 to 120-4 may be co-extruded together with the non-doping material (e.g., non-doping structures 120-31 to 120-33). In a specific embodiment, after the extrusion process, substrate 101D will have exposed regions (e.g., exposed surface area 102-22), dopant blocking regions (e.g., the surface areas under non-doping structures 120-31 to 120-33), and dopant ink covered regions (e.g., the surface areas under extruded structures 120-11 to 120-14). After thermal processing in a dopant ambient, the processed wafer will have three distinct regions with different doping levels.

Figure 12:
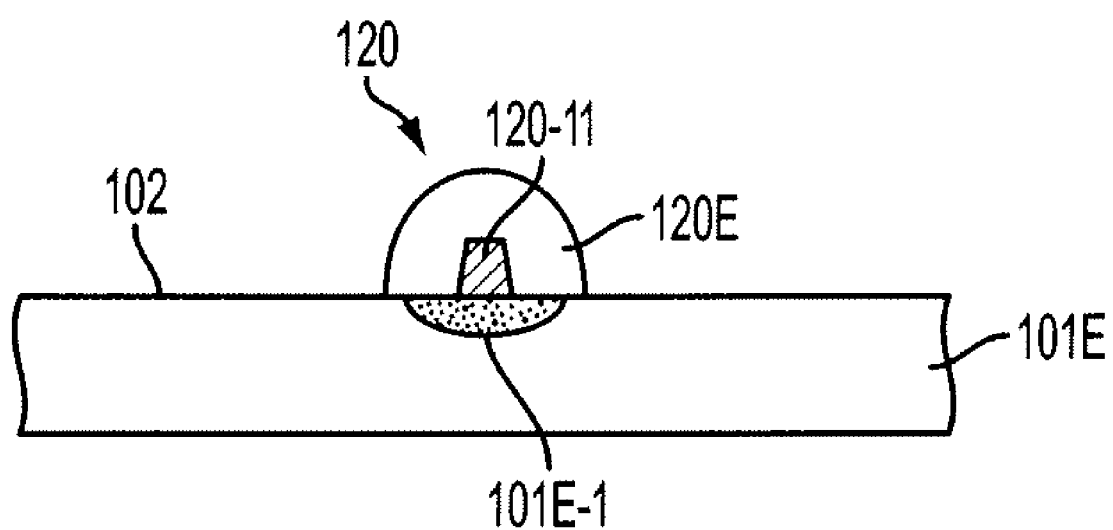
FIG. 12 is a simplified cross-sectional side view showing a capped dopant ink structure according to yet another embodiment of the present invention.

A known problem with the solid dopant source approach is that while the dopants are diffusing, they diffuse out of the source and onto other parts of the wafer, creating an undesirable doping effect in the surrounding portions of the wafer. In accordance with another embodiment of the present invention depicted in FIG. 12, a capping layer 120E is formed over each dopant ink extruded structure 120-1 to prevent it from contaminating other portions of the wafer. Capping structure 120E entirely covers extruded structure 120-1 in that it covers both the sides and upper surface of structure 120-1. Dopant structure 120-1 and capping structure 120E are necessarily aligned to one another due to the co-extrusion process, which is described in co-owned U.S. patent application Ser. No. 11/282,882, filed Nov. 17, 2005, entitled "Extrusion/Dispensing Systems and Methods", which is incorporated herein by reference in its entirety. In a specific embodiment of this invention, the extrusion head utilizes a combination of vertical and horizontal co-extrusion, which is described in Ser. No. 11/282,882 (cited above), to produce a composite bead of material in which the sides of the solid source that are not adjacent to the wafer are capped by a capping structure.

It is a further desirable feature that the ends of the line of solid dopant source are capped by the capping structure. It is an aspect of this invention that the flows of materials which form the doping source and the capping structure are varied. This variation in flow enables for example the production of a co-extruded line in which ends of the line are capped.

Although the present invention has been described with respect to certain specific embodiments, it will be clear to those skilled in the art that the inventive features of the present invention are applicable to other embodiments as well, all of which are intended to fall within the scope of the present invention. For example, the extruded structures disclosed in FIGS. 8 and 9 may comprise only one dopant ink (e.g., n-type) instead of two different dopant inks. In another example, the dopant paste, when fired could also create a passivation layer or antireflection coating. In another example, a single direct write printing step could fill the contact openings in the dielectric and form conducting lines on the device. In another example, a glass frit fire through method could be used eliminating a separate process step to open contact openings in the dielectric.

The invention claimed is:

1. A method for fabricating a device on a semiconductor substrate, the method comprising:
    extruding a first dopant bearing paste on a surface of the semiconductor substrate such that the first dopant bearing paste forms a first extruded structure on a first surface area of the semiconductor substrate, the first dopant bearing paste including a first dopant of a first dopant type; and
    heating the semiconductor substrate such that the first dopant diffuses through the first surface area into the semiconductor substrate, thereby forming a first doped region of the semiconductor substrate.

2. The method according to claim 1, further comprising removing residual portions of the first extrusion structure after said heating.

3. A method for fabricating a device on a semiconductor substrate, the method comprising:
    extruding a first dopant bearing material on a surface of the semiconductor substrate such that the first dopant bearing material forms a first extruded structure on a first surface area of the semiconductor substrate, the first dopant bearing material including a first dopant of a first dopant type;
    heating the semiconductor substrate such that the first dopant diffuses through the first surface area into the semiconductor substrate, thereby forming a first doped region of the semiconductor substrate;
    depositing a passivation layer on the surface of the semiconductor substrate over the first doped region,
    laser ablating portions of the passivation layer such that a plurality of contact openings are defined through the passivation layer to the surface area,
    disposing a conductive contact structure in each of the contact openings, and
    disposing at least one metal line structure onto an upper surface of the passivation layer such that said metal line structure contacts said first doped region by way of said conductive contact structure.

4. A method for fabricating a device on a semiconductor substrate, the method comprising:
    extruding a first dopant bearing material on a surface of the semiconductor substrate such that the first dopant bearing material forms a first extruded structure on a first surface area of the semiconductor substrate, the first dopant bearing material including a first dopant of a first dopant type;
    heating the semiconductor substrate such that the first dopant diffuses through the first surface area into the semiconductor substrate, thereby forming a first doped region of the semiconductor substrate;
    depositing a passivation layer on the surface of the semiconductor substrate over the first doped region,
    removing portions of the passivation layer such that a plurality of contact openings are defined through the passivation layer to the surface area,
    depositing a conductive contact structure into each of the contact openings using a direct-write metallization apparatus, and
    depositing at least one metal line structure onto an upper surface of the passivation layer such that said metal line structure contacts said first doped region by way of said conductive contact structure.

5. The method according to claim 1,
    wherein said extruding further comprises forming a second extruded structure on a second surface area of the semiconductor substrate,
    wherein said heating the semiconductor substrate further comprises diffusing said first dopant from said second extruded structure into a second doped region of the semiconductor substrate through the second surface area.

6. The method according to claim 5, wherein the first doped region is separated from the second doped region by a first undoped region of the semiconductor substrate.

7. The method according to claim 5, wherein said extruding comprises simultaneously extruding a third paste such that the extruded third paste forms a third extruded structure on a third surface area of the semiconductor substrate that is disposed between the first surface area and the second surface area.

8. The method according to claim 7, wherein extruding said third paste comprises forming a continuous sheet such that said third extruded structure extends from a side edge of said first extruded structure to a side edge of said second extruded structure.

9. The method according to claim 8, wherein extruding said first dopant bearing paste comprises compressing said first paste between said third extruded structure and a fourth extruded structure comprising said third paste.

10. The method according to claim 7, wherein the third paste has a relatively light dopant content relative to the first dopant bearing paste.

11. The method according to claim 1, wherein said heating comprises disposing said semiconductor substrate in an ambient including a gaseous phase dopant.

12. The method according to claim 7, wherein extruding said third paste comprises forming a capping structure that entirely covers said first extruded structure.

13. The method according to claim 1,
wherein said extruding further comprises simultaneously extruding a second dopant bearing paste, such that the extruded second dopant bearing paste forms a second extruded structure on a second surface area of the semiconductor substrate, the second dopant bearing paste including a second dopant of a second dopant type,
wherein said heating the semiconductor substrate further comprises simultaneously causing said second dopant to diffuse through the second surface area into the semiconductor substrate, thereby forming a second doped region.

14. The method according to claim 13,
wherein the first doped region has a first, relatively heavy doping level,
wherein the second doped region has a second, relatively heavy doping level,
wherein the third region has one of a third, relatively light doping level or an intrinsic state.

15. The method according to claim 14, further comprising removing residual portions of at least one of the first extrusion structure and the second extrusion structure after said heating.

16. The method according to claim 13, further comprising:
depositing a passivation layer on the surface of the semiconductor substrate over the first and second doped regions,
laser ablating portions of the passivation layer such that a plurality of contact openings are defined through the passivation layer to each of the first and second surface areas,
depositing a conductive contact structure into each of the contact openings using a direct-write metallization apparatus, and
depositing metal line structures onto an upper surface of the passivation layer such that each metal line structure contacts a group of said contact structures that are disposed over a corresponding one of said first and second doped regions.

17. The method according to claim 13, wherein said extruding further comprises simultaneously extruding a third paste such that the extruded third paste forms a third extruded structure on a third surface area of the semiconductor substrate that is disposed between the first surface area and the second surface area.

18. The method according to claim 17, wherein extruding said third paste comprises forming a continuous sheet such that said third extruded structure extends from a side edge of said first extruded structure to a side edge of said second extruded structure.

* * * * *